United States Patent
Lan et al.

(10) Patent No.: US 9,472,758 B2
(45) Date of Patent: Oct. 18, 2016

(54) HIGH ENDURANCE NON-VOLATILE STORAGE

(71) Applicant: SANDISK 3D LLC, Milpitas, CA (US)

(72) Inventors: Zhida Lan, San Jose, CA (US); Abhijit Bandyopadhyay, San Jose, CA (US); Christopher Petti, Mountain View, CA (US); Li Xiao, San Jose, CA (US); Girish Nagavarapu, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/538,763

(22) Filed: Nov. 11, 2014

(65) Prior Publication Data

US 2016/0133836 A1    May 12, 2016

(51) Int. Cl.
*G11C 5/02* (2006.01)
*H01L 45/00* (2006.01)
*G11C 13/00* (2006.01)
*H01L 27/24* (2006.01)

(52) U.S. Cl.
CPC ........... *H01L 45/16* (2013.01); *G11C 13/0069* (2013.01); *H01L 27/2481* (2013.01); *G11C 13/0004* (2013.01); *G11C 13/0007* (2013.01); *G11C 13/0011* (2013.01); *G11C 2013/0083* (2013.01); *G11C 2013/0092* (2013.01); *G11C 2213/71* (2013.01); *G11C 2213/77* (2013.01); *G11C 2213/78* (2013.01); *G11C 2213/79* (2013.01)

(58) Field of Classification Search
CPC  H01L 45/16; H01L 27/2481; G11C 13/0069
USPC ................. 365/51, 46, 71, 100, 148
See application file for complete search history.

(56) References Cited

U.S. PATENT DOCUMENTS

| | | | |
|---|---|---|---|
| 8,787,066 B2 | 7/2014 | Wang | |
| 8,809,159 B2 | 8/2014 | Wang | |
| 8,817,524 B2 | 8/2014 | Wang | |
| 2007/0285965 A1* | 12/2007 | Toda | G11C 5/02 365/148 |
| 2013/0292634 A1 | 11/2013 | Chen | |
| 2014/0092668 A1* | 4/2014 | Kim | G11C 13/0007 365/148 |
| 2014/0103284 A1 | 4/2014 | Hsueh | |

(Continued)

OTHER PUBLICATIONS

Sriraman, et al., "HfO2 Based Resistive Switching Non-Volatile Memory (RRAM) and Its Potential for Embedded Applications," 2012 International Conference on Solid-State and Integrated Circuit, IPCSIT vol. 32, 2012.

*Primary Examiner* — Tha-O H Bui
(74) *Attorney, Agent, or Firm* — Vierra Magen Marcus LLP

(57) ABSTRACT

The manufacturing of the non-volatile storage system includes depositing one or more layers of reversible resistance-switching material for a non-volatile storage element. Prior to operation, either during manufacturing or afterwards, a forming operation is performed. In one embodiment, the forming operation includes applying a forming voltage to the one or more layers of reversible resistance-switching material to form a first region that includes a resistor and a second region that can reversibly change resistance at a low current, the resistor is formed in response to the forming condition and is not deposited on the device. In some embodiments, programming the non-volatile storage element includes applying a programming voltage that increases in voltage over time at low current but does not exceed the final forming voltage.

18 Claims, 21 Drawing Sheets

(56) References Cited

U.S. PATENT DOCUMENTS

| | | |
|---|---|---|
| 2014/0175355 A1 | 6/2014 | Wang |
| 2014/0175360 A1 | 6/2014 | Tendulkar |
| 2014/0175362 A1 | 6/2014 | Tendulkar |
| 2014/0175367 A1 | 6/2014 | Tendulkar |
| 2014/0192585 A1 | 7/2014 | Hashim |
| 2014/0192586 A1 | 7/2014 | Nardi |
| 2014/0241031 A1 | 8/2014 | Bandyopadhyay |
| 2014/0252298 A1 | 9/2014 | Li |
| 2014/0264223 A1 | 9/2014 | Tendulkar |
| 2014/0264231 A1 | 9/2014 | Wang |

* cited by examiner

Programming

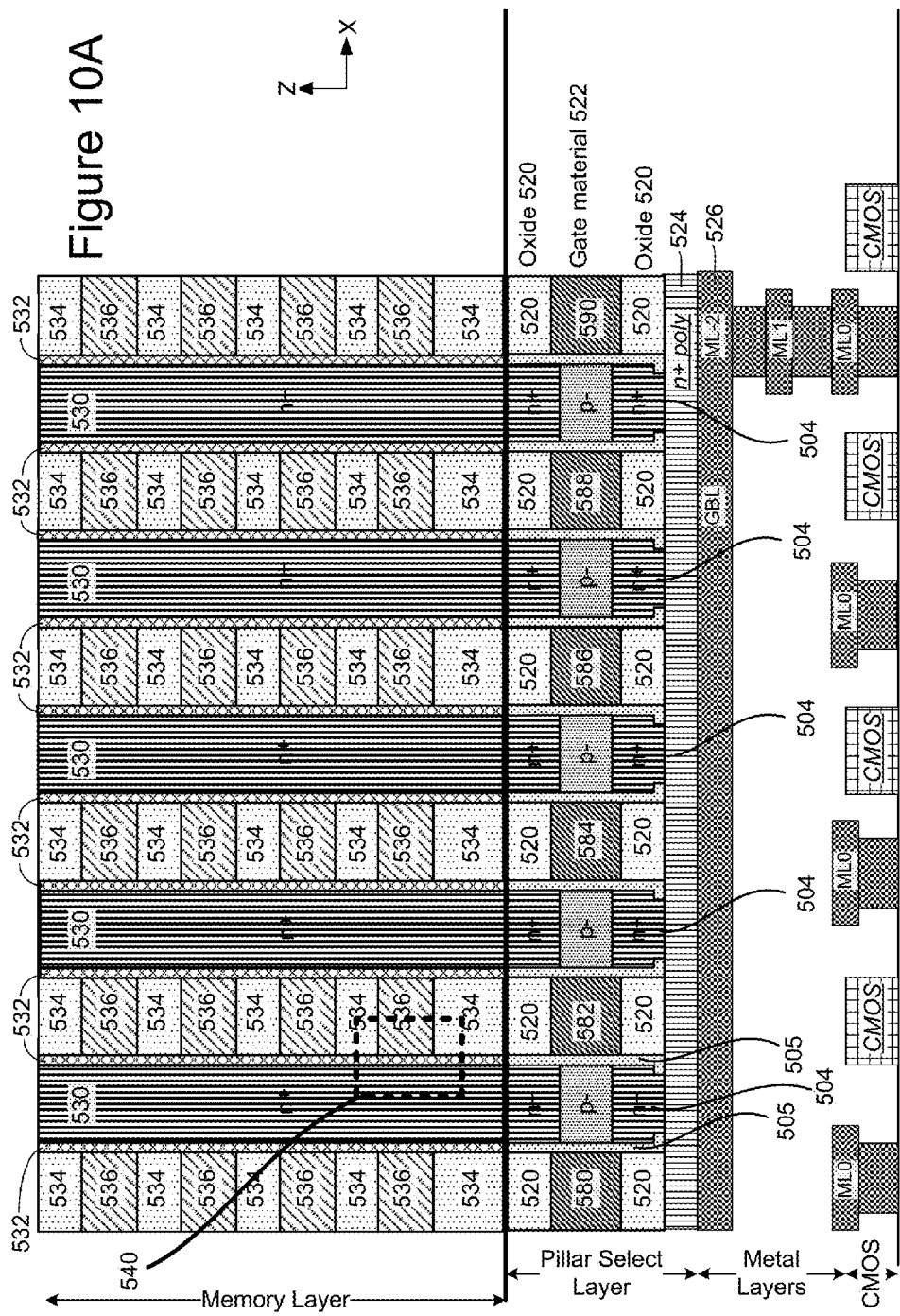

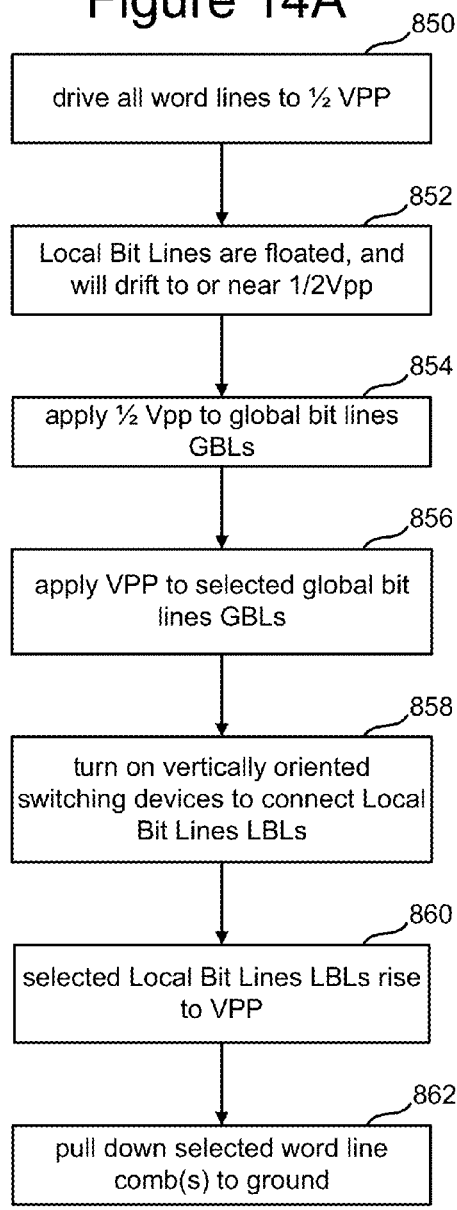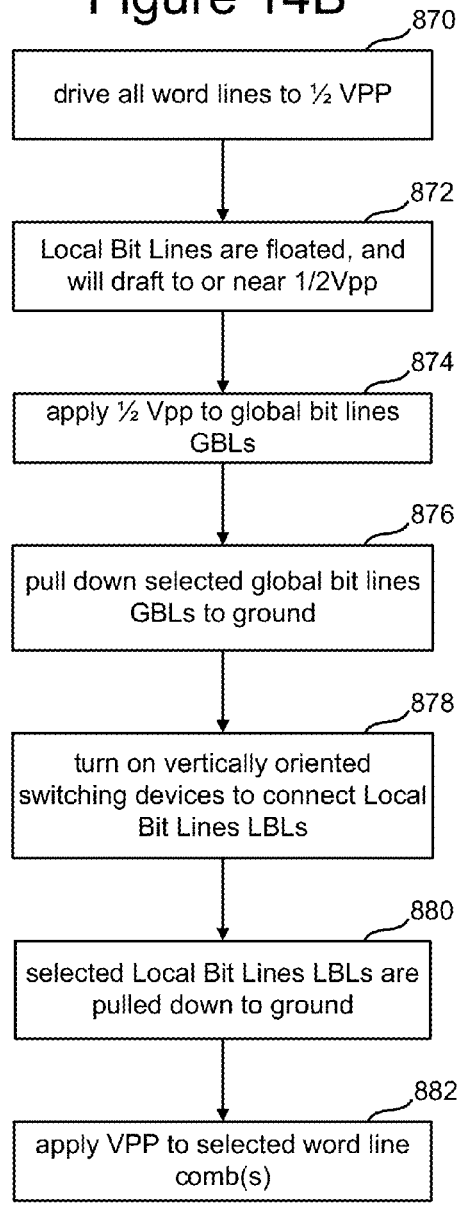

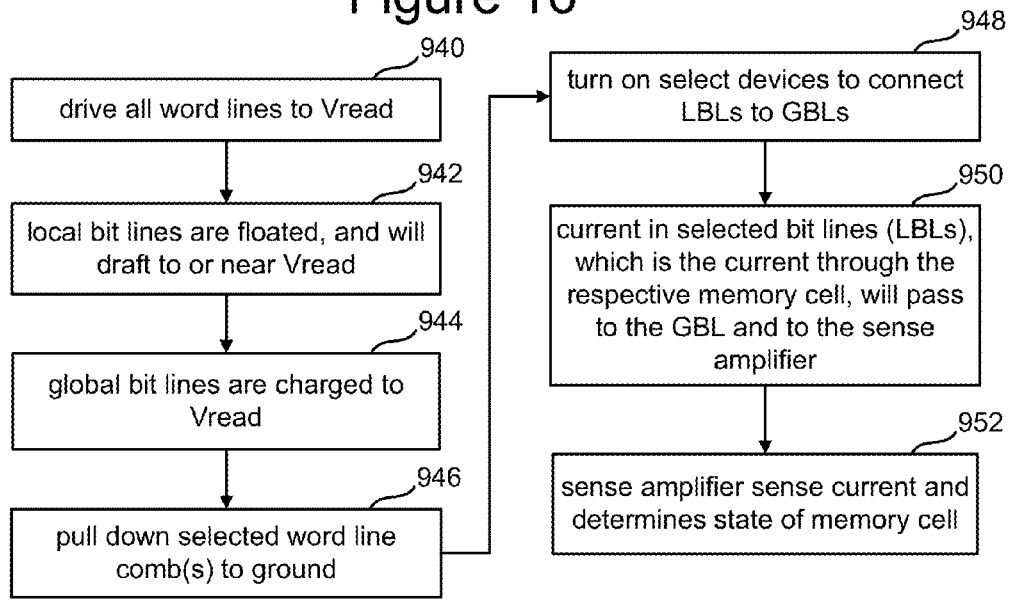
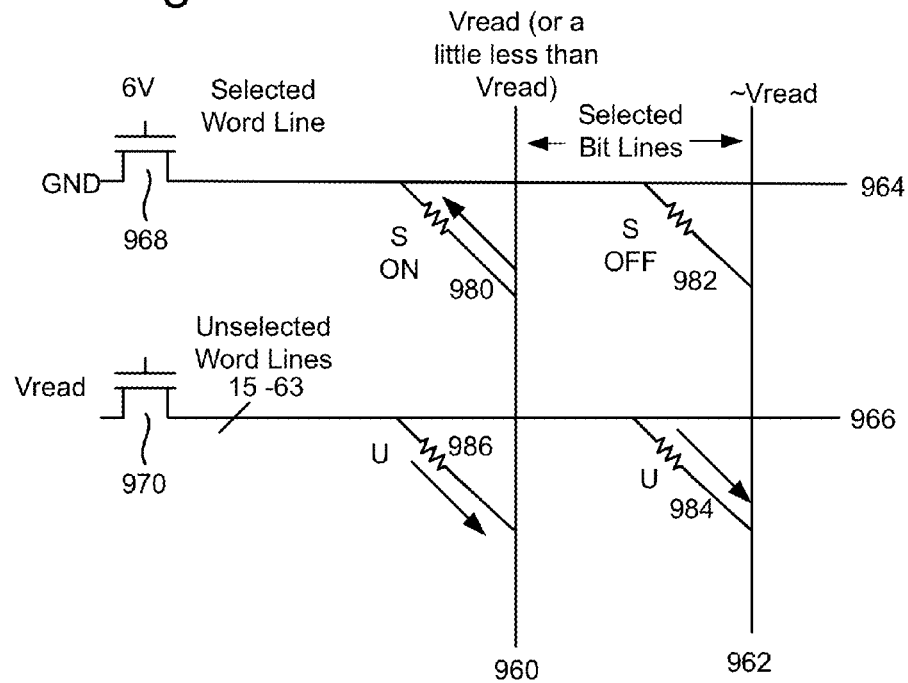

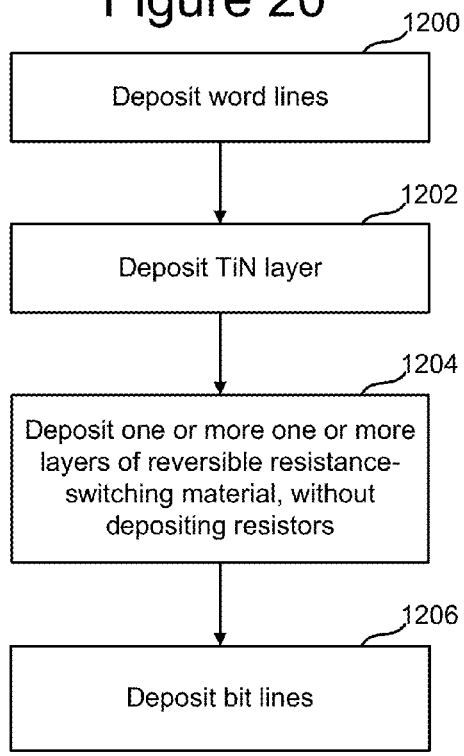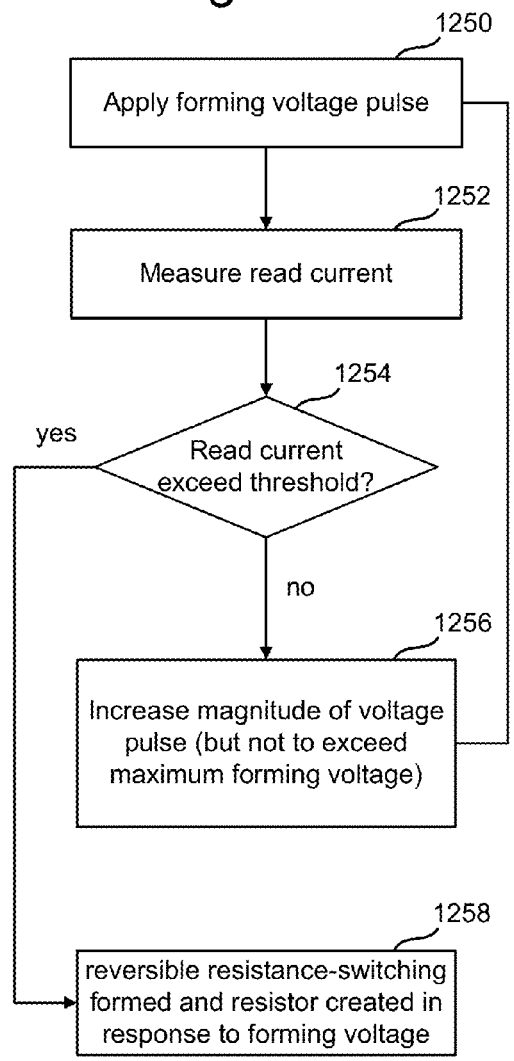

HIGH ENDURANCE NON-VOLATILE STORAGE

BACKGROUND OF THE INVENTION

1. Field of the Invention

The present invention relates to technology for non-volatile storage.

2. Description of the Related Art

One example of non-volatile storage uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in an array. The state of such a memory element is typically changed by proper voltages being placed on the intersecting conductors. These voltages are necessarily also applied to a large number of other unselected memory elements because they are connected along the same conductors as the selected memory elements being programmed or read.

To achieve greater density, memory elements can be part of a three dimensional memory structure. Achieving cost competitive three dimensional memory that consumers will purchase requires that the device operate reliably over many thousands of cycles. This property is referred to as endurance.

BRIEF DESCRIPTION OF THE DRAWINGS

FIG. 10A illustrates one embodiment of a memory structure with vertical local bit lines above the substrate and vertically oriented select devices above the substrate that connect the bit lines to global bit lines.

FIGS. 14A and B are flow charts describing embodiments for programming the memory system.

FIG. 16 is a flow chart describing one embodiment for reading the memory system.

FIG. 17 is a schematic of a portion of the memory system, depicting the programming operation.

FIG. 20 is a flow chart describing one embodiment of a process performed when manufacturing non-volatile storage.

FIG. 21 is a flow chart describing one embodiment of a forming operation.

DETAILED DESCRIPTION

Figure 1:
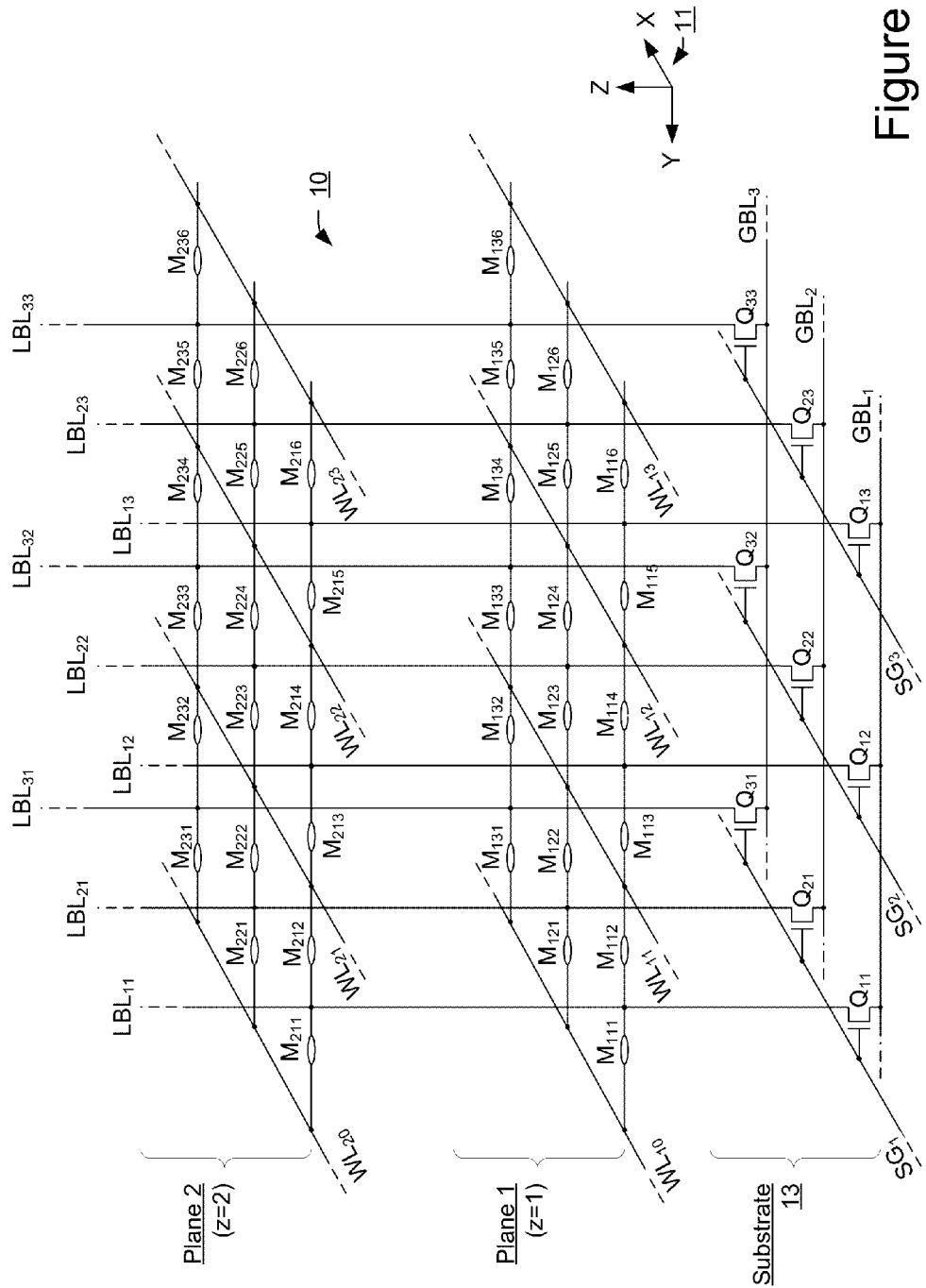
FIG. 1 is an equivalent circuit of a portion of an example three-dimensional array of variable resistance memory elements, wherein the array has vertical bit lines.

The manufacturing of the non-volatile storage system, including a three dimensional memory structure, comprises depositing one or more layers of reversible resistance-switching material for a non-volatile storage element. Prior to user operation, either during manufacturing or afterwards, a forming operation is performed. In one embodiment, the forming operation includes applying power (forming voltage, forming current and pulse width) to the one or more layers of reversible resistance-switching material to form a first region that includes a resistor and a second region that can reversibly change resistance. The first region resistor is formed in response to the forming voltage (and the forming current), rather than being deposited on the device. In some embodiments, programming the non-volatile storage element includes applying a programming voltage that increases in voltage over time but does not exceed the final forming voltage. The resistor that is formed in the first region is used to protect the switching layer at low current, and enable long endurance. In one embodiment, the resistance of the resistor is tunable based on the pulse width of the forming voltage, pulse magnitude of the forming voltage, current provided, or thickness of the one or more layers of reversible resistance-switching material. Thereafter, cycle condition (voltage, current and pulse width) is controlled to minimize the chance to degrade the local resistor for high endurance.

In one embodiment, the memory elements used in the three-dimensional memory array (or other three dimensional structure) are preferably variable resistive memory elements. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current through it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

The resistance of the memory element, and thus its detectable storage state, can be repetitively set from an initial level to another level and then re-set back to the initial level. Because it can be set and reset, the material is said to be reversible resistance-switching material. For some materials, the amount or duration of the voltage, current, electric field, heat and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. The three-dimensional array architecture herein is quite versatile in the way it may be operated.

This three-dimensional architecture also allows limiting the extent and number of unaddressed (non-selected) resistive memory elements across which an undesired level of voltage is applied during reading and programming operations conducted on other addressed (selected) memory elements. The risk of disturbing the states of unaddressed memory elements and the levels of leakage current passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture herein may be made to include a much larger number of addressed memory elements without introducing errors in reading and exceeding reasonable power supply capabilities.

In addition, the three-dimensional architecture herein allows variable resistance memory elements to be connected at orthogonal crossings of bit and word line conductors without the need for diodes or other non-linear elements being connected in series with the variable resistive elements. In existing arrays of variable resistance memory elements, a diode is commonly connected in series with each memory element in order to reduce the leakage current though the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The term connected refers to direct and indirect connections.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array are thus reduced, as is the cost of the resulting integrated circuit.

Referring initially to FIG. 1, an architecture of one example embodiment of a three-dimensional memory 10 is schematically and generally illustrated in the form of an equivalent circuit of a portion of such a memory. A standard three-dimensional rectangular coordinate system 11 is used for reference, the directions of each of vectors x, y and z being orthogonal with the other two. In another embodiment direction x and x are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the select devices to which it is connected. The remaining row select lines receive voltages that keep their connected select devices $Q_{xy}$ off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above the substrate 13. Two planes 1 and 2 are illustrated in FIG. 1 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 2:
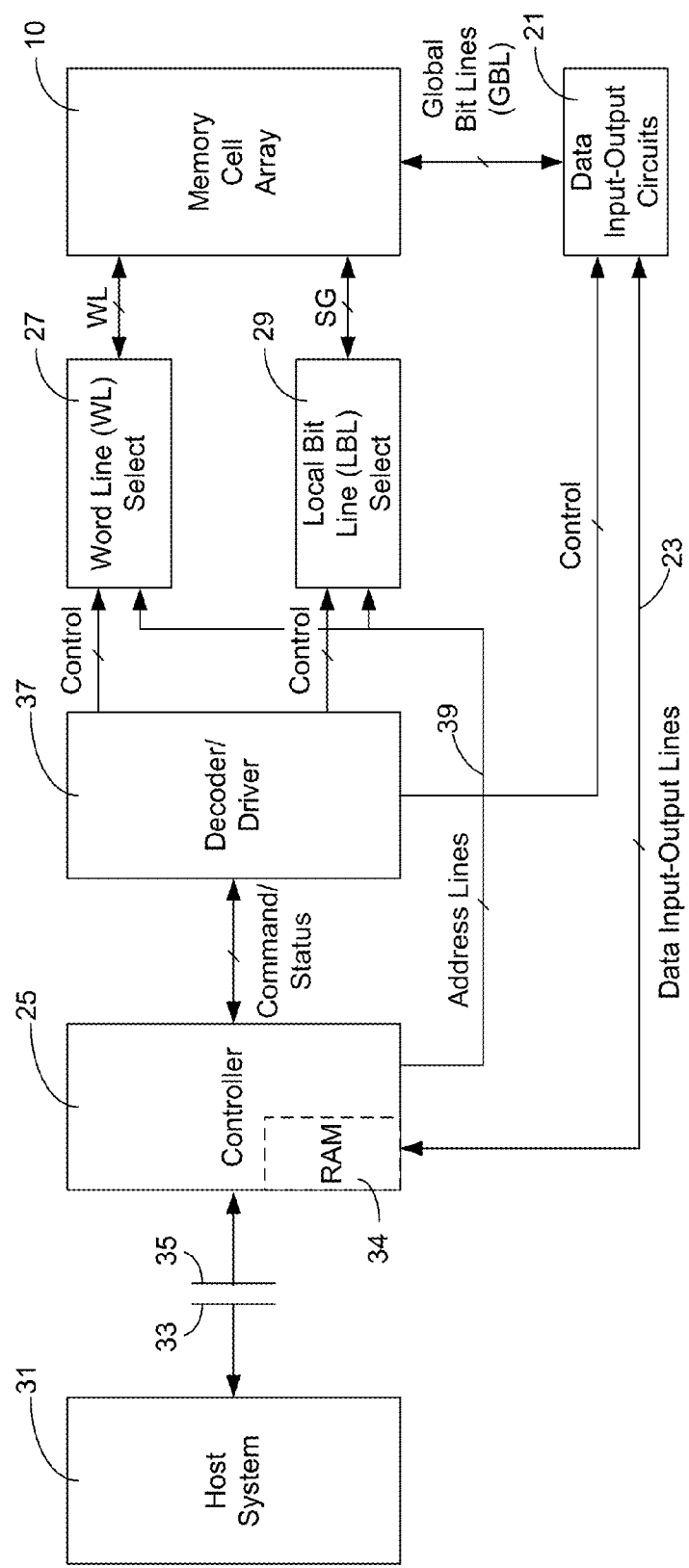
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements (that have reversible resistance-switching material) may be operated in a manner similar to current flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
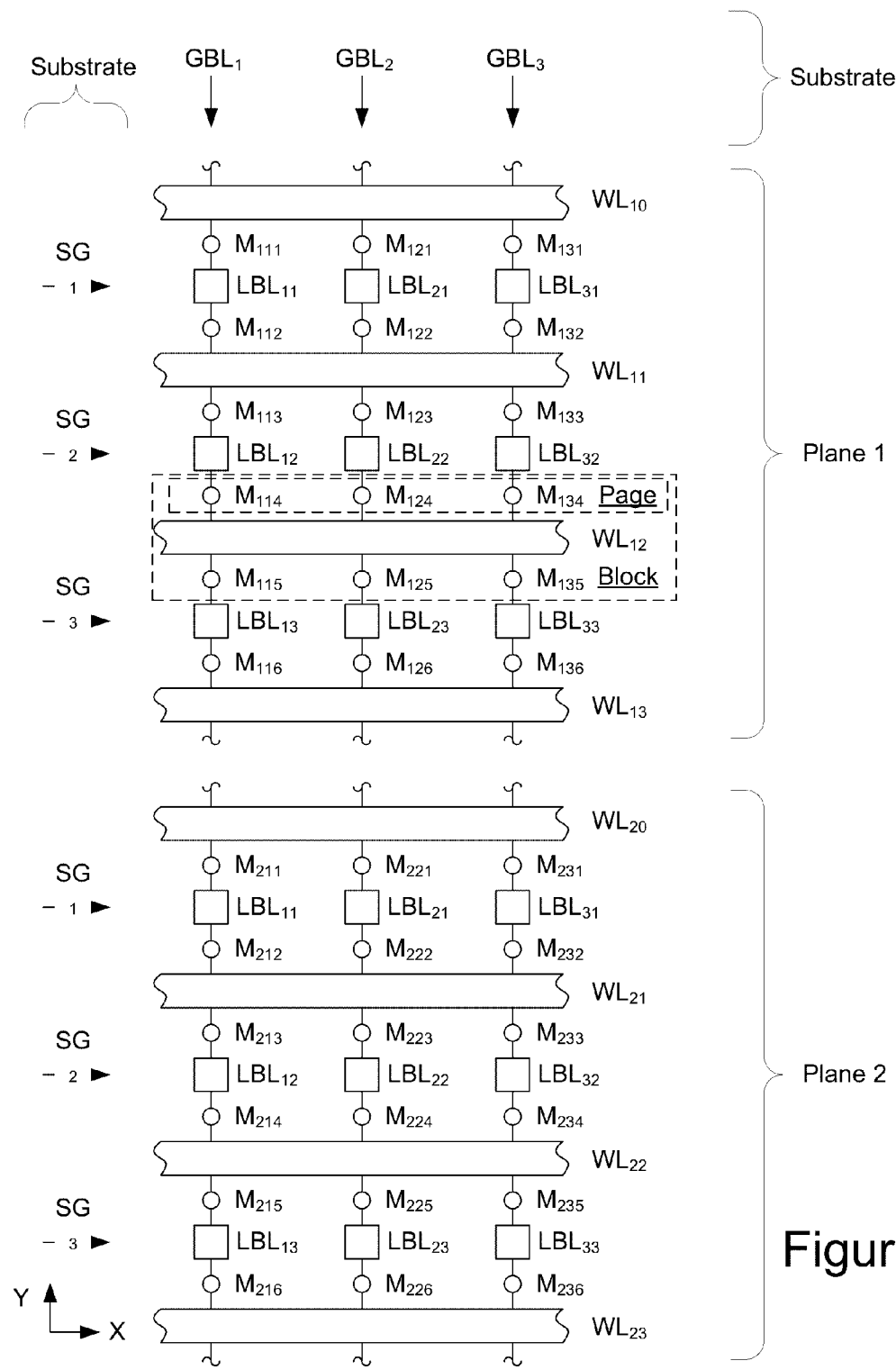
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.

3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
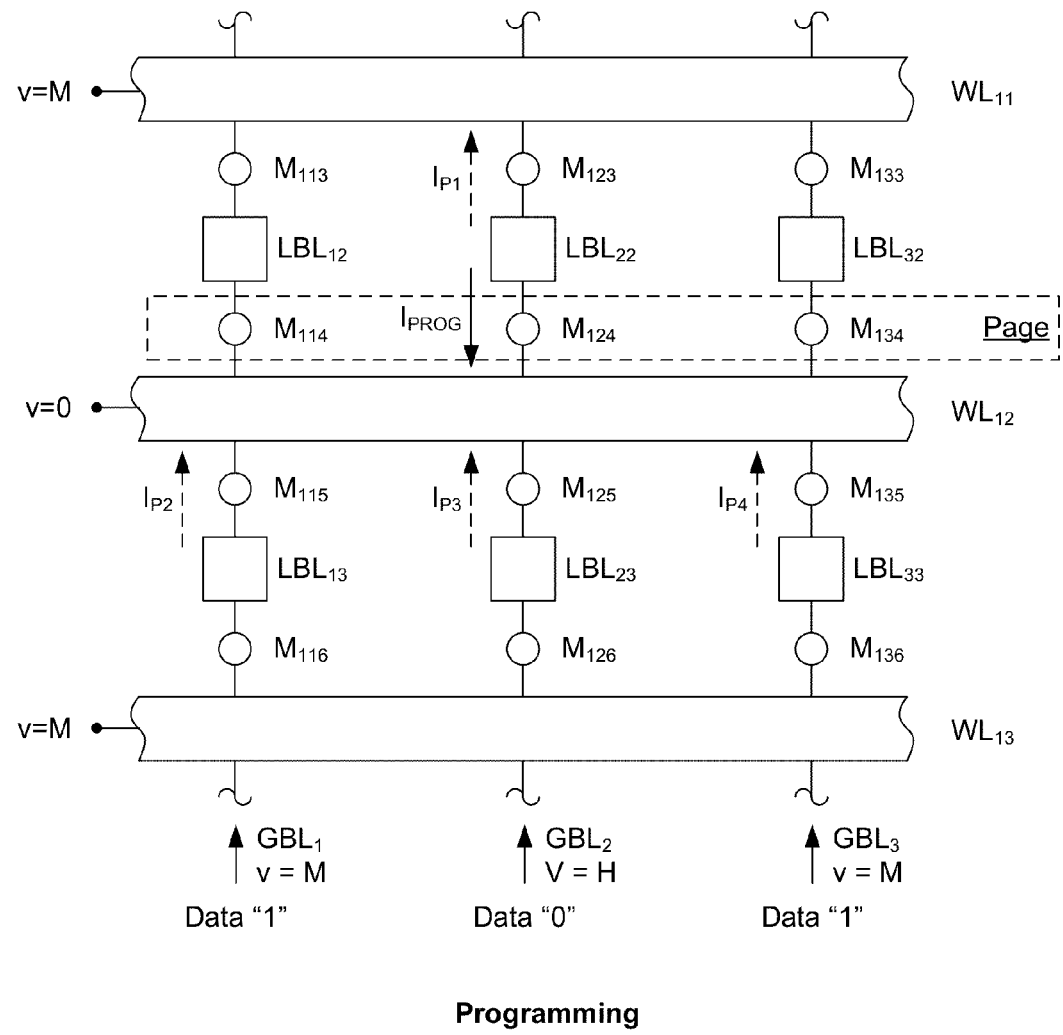
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the row select lines below and on either side of the selected word line to the H' voltage level, in order to select a page for programming. For the page indicated in FIGS. 3 and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
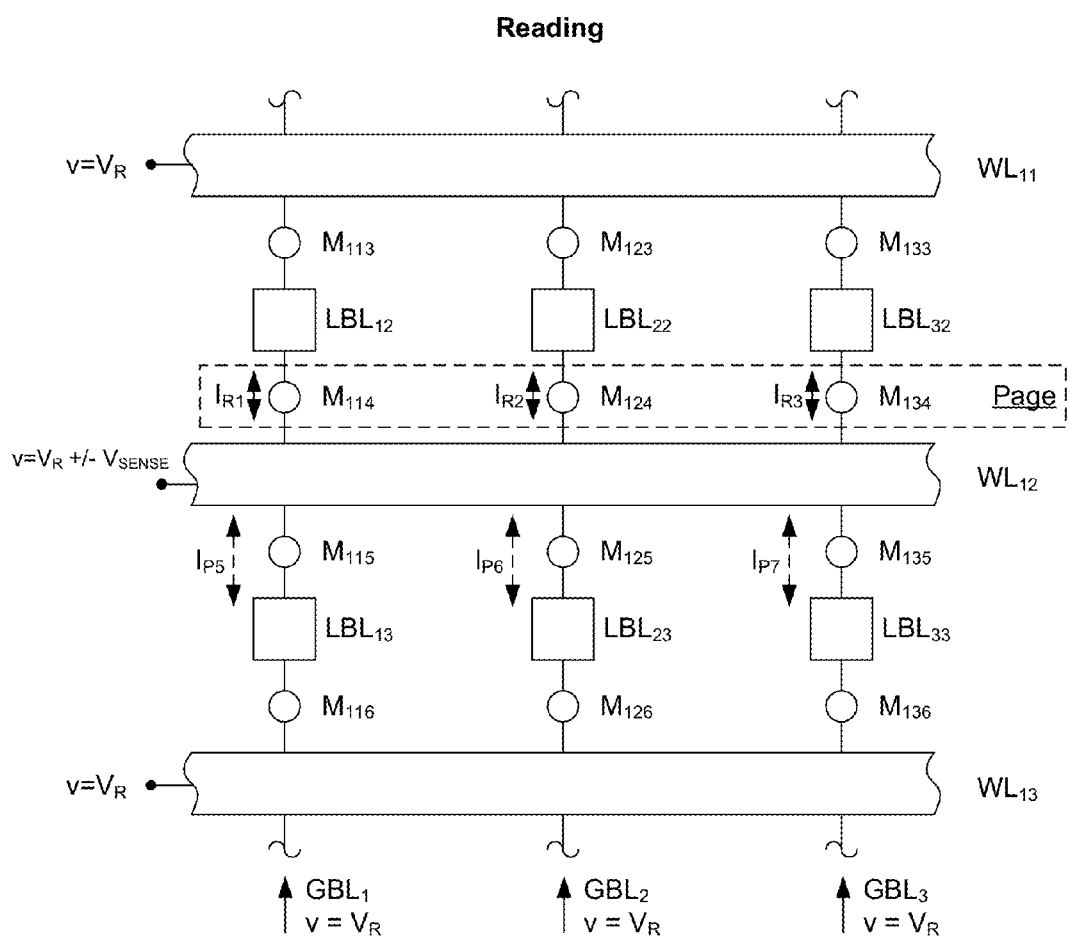
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the row select line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.

3. Set the selected word line ($WL_{12}$) to a voltage of $V_R \pm V$sense. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the select devices ($Q_{12}$, $Q_{22}$ and $Q_{32}$) by removing the voltage from the row select line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V_{sense}$ without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V_{sense}$ but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current vs voltage relationship are also envisioned. For example as the voltage across a HfOx memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

The material used for the non-volatile memory elements $M_{zxy}$ in the array of FIG. 1 can be a chalcogenide, a metal oxide, CMO, or any one of a number of reversible resistance-switching materials that exhibit a stable, reversible shift in resistance in response to an external voltage applied to or current passed through the material.

Metal oxides are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include HfOx, ZrOx, WOx, NiOx, CoOx, CoAlOx, MnOx, $ZnMn_2O_4$, ZnOx, TaOx, NbOx, HfSiOx, HfAlOx. Suitable top electrodes include metals with a high work function (typically>4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g, bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

The memory storage element may comprise one layer of reversible resistance-switching material or multiple layers of reversible resistance-switching material. Examples include:
1. N+ poly/HfOx(3 nm)/TiN. The HfOx can be deposited by ALD, CVD or PVD
2. N+ poly/SiOy (1 nm)/HfOx(1 nm)/TiN. The SiOx, HfOx can be deposited by ALD, CVD or PVD.
3. P+ poly/SiOy (1 nm)/HfOx(1 nm)/TiN. The SiOx, HfOx can be deposited by ALD, CVD or PVD.
4. N+ poly/SiOy (1 nm)/AlfOx(1 nm)/TiN. The SiOx, AlOx can be deposited by ALD, CVD or PVD.
5. P+ poly/SiOy (1 nm)/AlOx(1 nm)/TiN. The SiOx, HfOx can be deposited by ALD, CVD or PVD.
6. N+ poly/SiOy (1 nm)/TaOx(1 nm)/TiN. The SiOx, TaOx can be deposited by ALD, CVD or PVD.
7. P+ poly/SiOy (1 nm)/TaOx(1 nm)/TiN. The SiOx, TaOx can be deposited by ALD, CVD or PVD.
8. N+ poly/TaOy (1 nm)/AlfOx(1 nm)/TiN. The SiOx, AlOx can be deposited by ALD, CVD or PVD
9. P+ poly/TaOy (1 nm)/AlOx(1 nm)/TiN. The SiOx, HfOx can be deposited by ALD, CVD or PVD.
10. N+ poly/TaOy (1 nm)/TaOx(1 nm)/TiN. The TaOx, TaOx can be deposited by ALD, CVD or PVD.
11. P+ poly/TaOy (1 nm)/TaOx(1 nm)/TiN. The TaOx, TaOx can be deposited by ALD, CVD or PVD.
12. TiN/SiOx(1 nm)/GST(2 nm)/W, The SiOx, phase change material GST can be deposited by ALD, CVD or PVD.

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Figure 6:
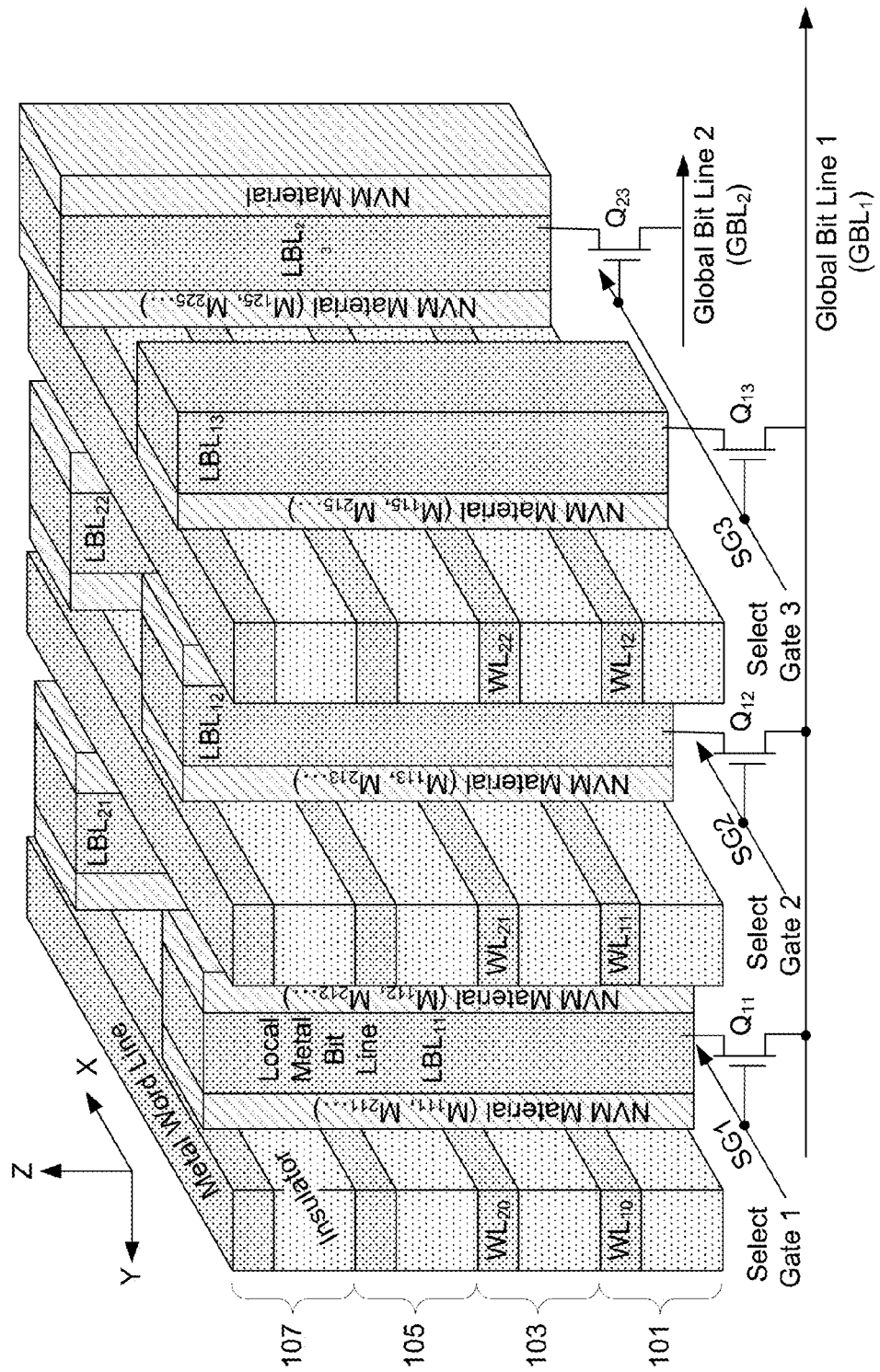
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 6, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

To enable the memory to be denser (e.g., more memory elements per area), the size of the memory elements can be made smaller and the memory elements can be arranged closer to each other than in the past. To enable the memory elements to be closer to each other, one embodiment uses a vertically oriented select device (e.g., three terminal switch and/or select transistor) for connecting the individual local bit line pillars to the respective global bit lines. For example, the select devices $Q_{11}, Q_{12}, \ldots, Q_{21}, Q_{22}, \ldots$ of FIG. 1 can be implemented as vertically oriented select devices. In one embodiment, each vertically oriented select device is a pillar select device that is formed as a vertical structure, switching between a local bit line pillar and a global bit line. The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented select devices above, but not in, the substrate allows the memory elements to be arranged in a more compact fashion, thereby increasing density. Additionally, positioning the vertically oriented select devices above the substrate allows for other devices (e.g., the word line drivers) to be positioned in the substrate under the memory array rather than outside of the array, which allows the integrated circuit to be smaller.

For example, a pillar shaped Thin Film Transistor (TFT) FET or JFET can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
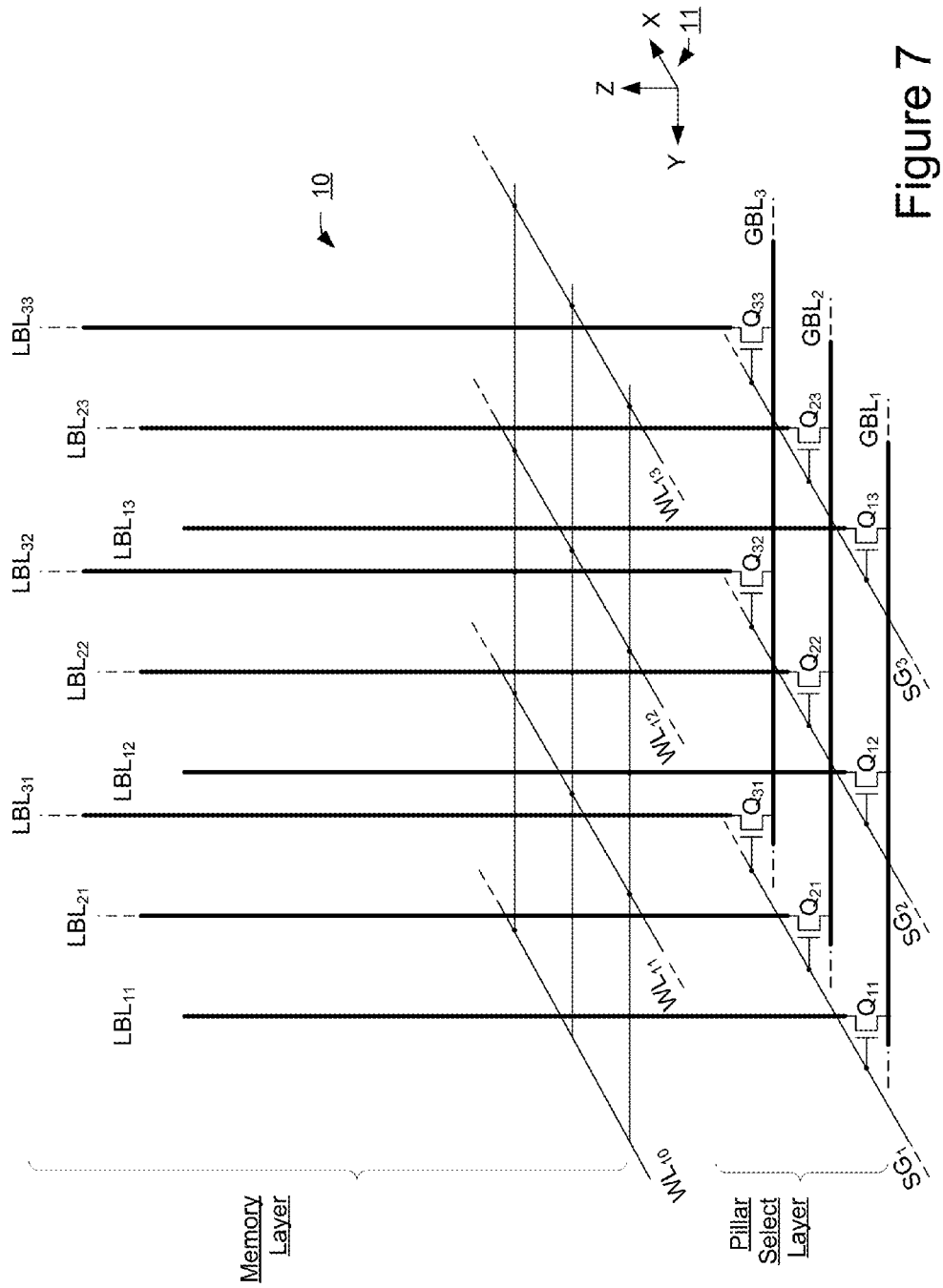
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented select devices (such as $Q_{11}$, $Q_{12}$, ..., $Q_{21}$, $Q_{22}$, ..., etc) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as $WL_{10}$, $W_{11}$, ..., etc without showing the memory elements that exist between each crossing of a word line and a bit line.

Figure 8B:
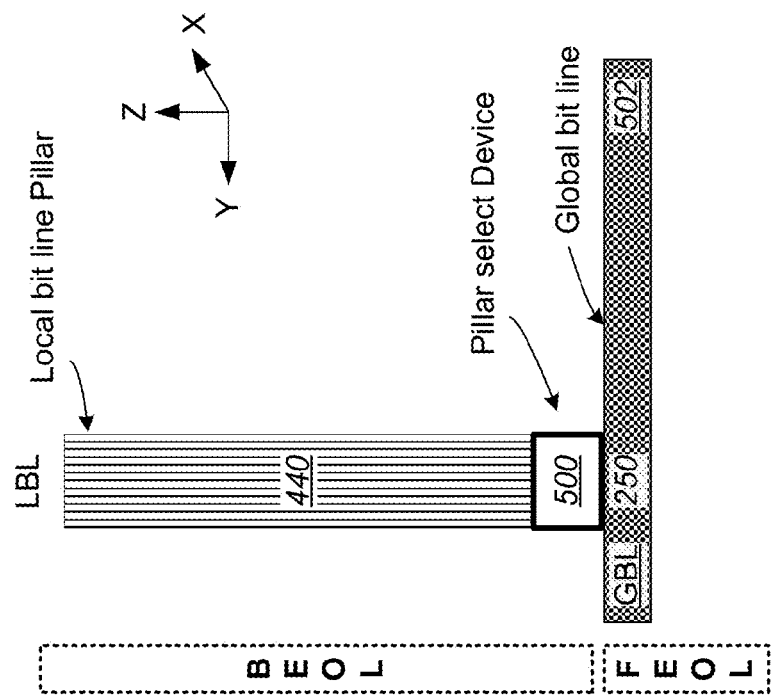
FIG. 8B is a plane view that depicts a vertical bit line, a vertically oriented select device and a global bit line.
Figure 8A:
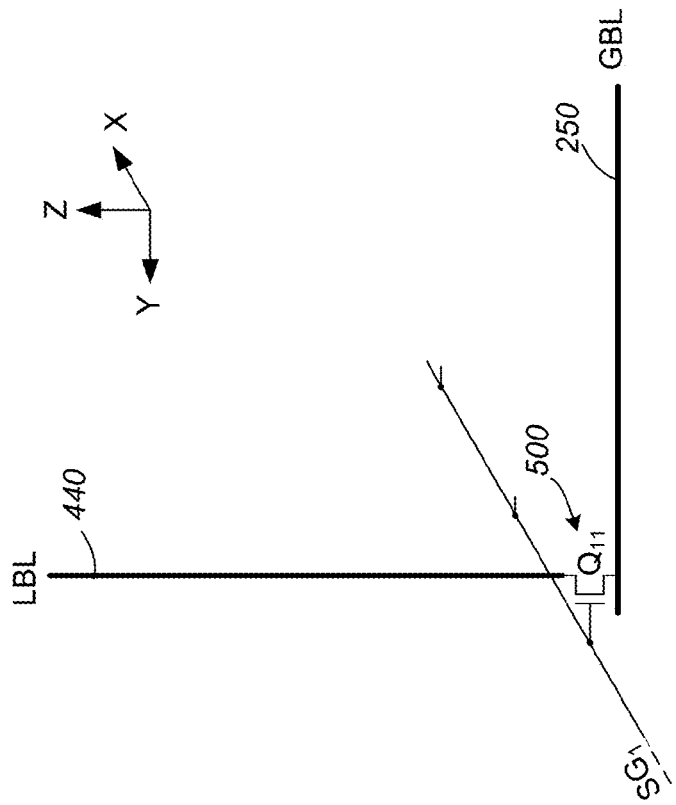
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as $Q_{11}$. The gate of the select transistor $Q_{11}$ is controllable by a signal exerted on a row select line $SG_1$.

FIG. 8B illustrates the structure of the vertically oriented select device in relation to the local bit line and the global bit line. The global bit line such as GBL 250 is formed below the vertically oriented select device, in the FEOL as part of the metal layer-1 or metal layer-2 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to the global bit line GBL.

Figure 9:
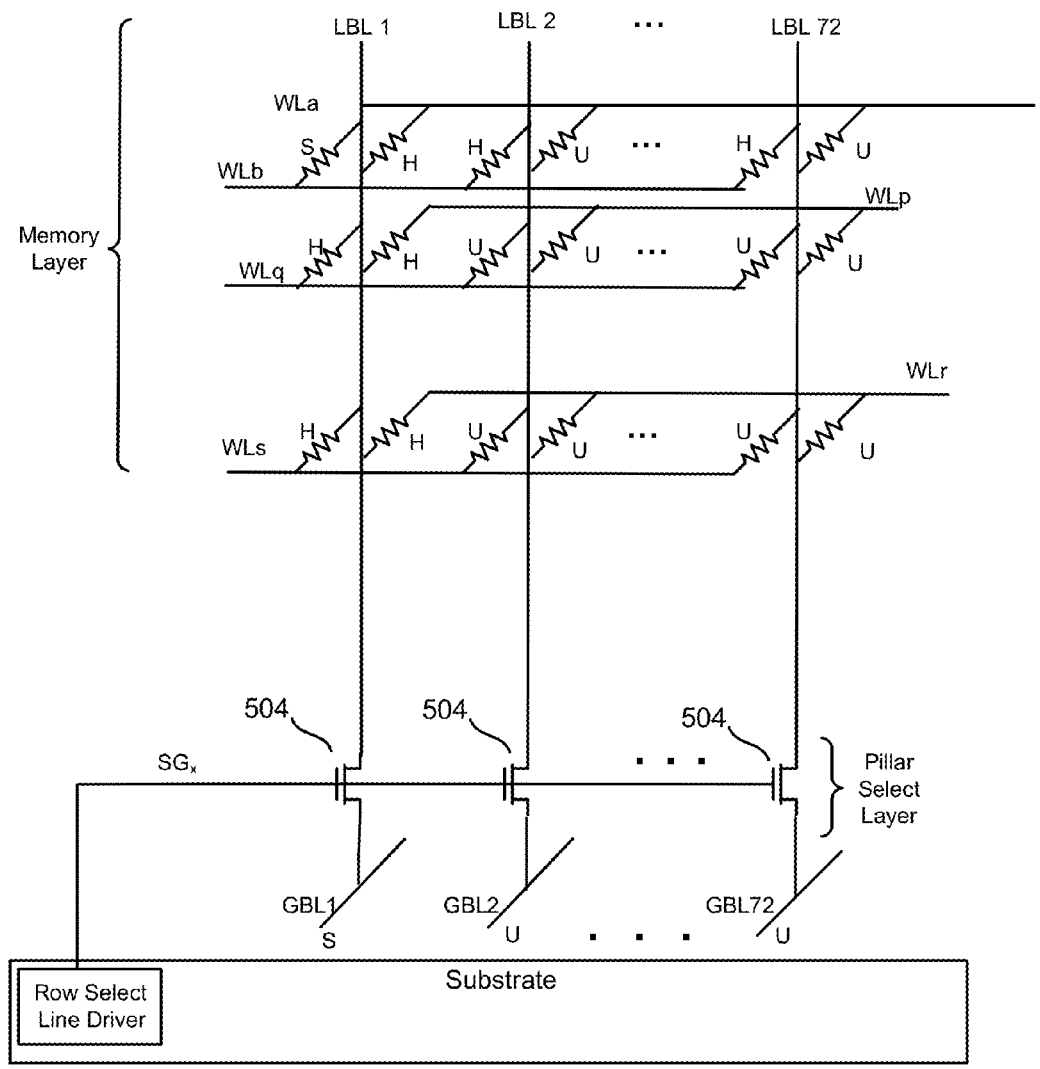
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, ... LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented select devices 504 of the Pillar Select Layer. The signal $SG_x$ driving the set of vertically oriented select devices 504 depicted in FIG. 9 is controlled by the Row Select Line Driver. Note that the Row Select Line Driver is implemented in the substrate. The global bit lines (GBL1, GBL2, ... GBL72) are implemented in the metal lines above the substrate. FIG. 9 shows one slice taken along the word line direction such that each of the bit lines depicted in FIG. 9 are connected to different global bit lines via the vertically oriented select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line $SG_x$ causes all of the vertically oriented select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

FIG. 10A is a cross-sectional view of a memory structure using the vertically oriented select device discussed above and the memory structure of FIG. 6. As described below, the memory structure of FIG. 10A is a continuous mesh array of memory elements because there are memory elements connected to both sides of the bit lines and memory elements connected to both sides of the word lines. At the bottom of FIG. 10A, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, ... of FIG. 1), which are labeled in FIG. 10 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate. Directly below each vertical bit line 530 are the vertically oriented select devices 504, each of which comprises (in one example embodiment) a n+/p-/n+ TFT. Each of the vertically oriented select devices 504 have oxide layers 505 on each side. FIG. 10 also shows an n+ polysilicon layer 524. As can be seen, the npn TFT of vertically oriented select devices 504 can be used to connect the global bit line GBL (layer 526) with any of the vertical bit lines 530.

FIG. 10A shows six row select lines ($SG_x$) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

Figure 10B:
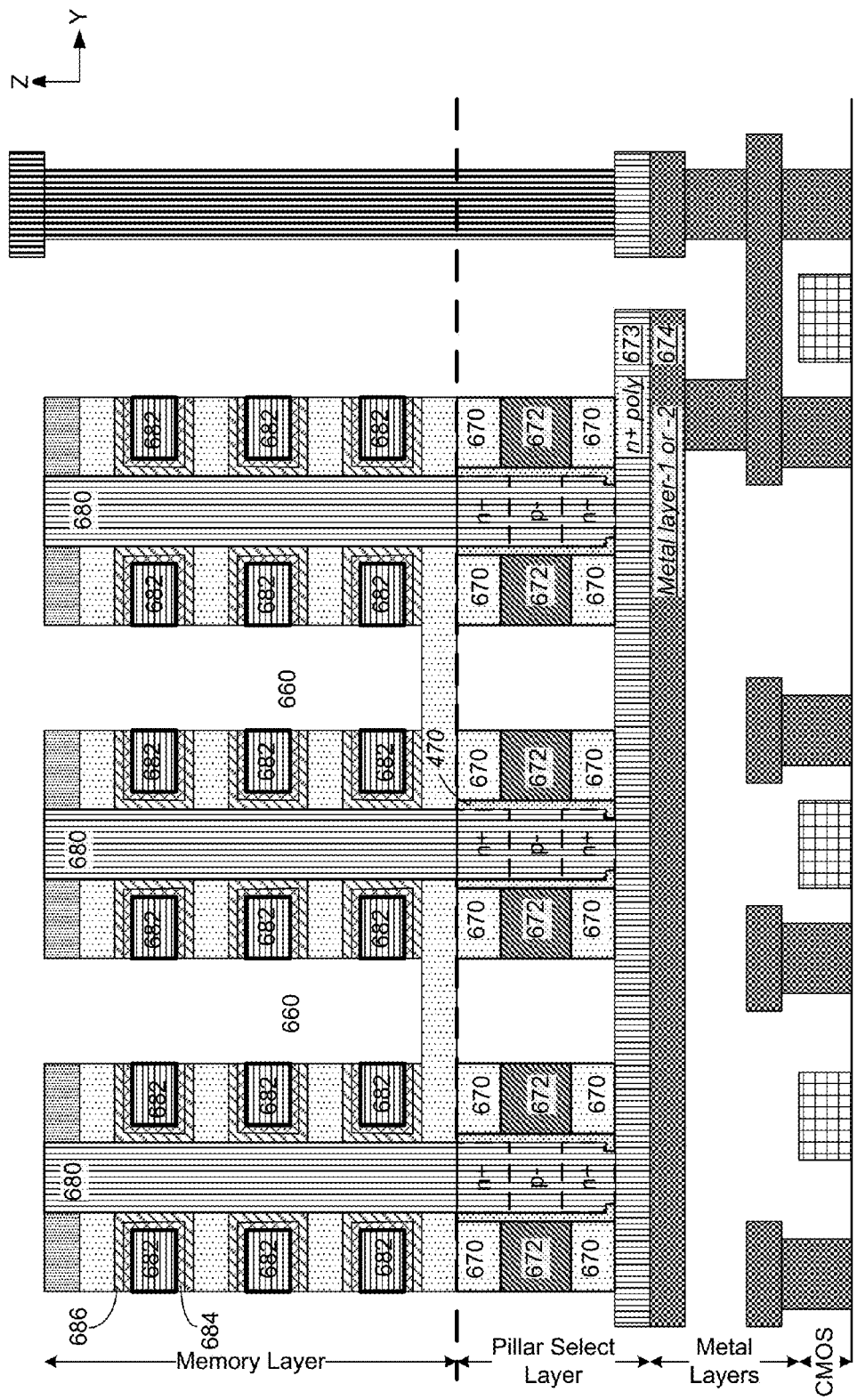
FIG. 10B illustrates one embodiment of a memory structure with vertical local bit lines above the substrate and vertically oriented select devices above the substrate that connect the bit lines to global bit lines.

FIG. 10B shows another embodiment of a memory system that includes vertical bit lines. However, in the embodiment of FIG. 10B, each word line will only have a memory element on one side of the word line. Therefore, there are gaps/trenches 660 between vertical bit lines. For example, on each side of a vertical bit line 680 are sets of word lines 682. Each word line 682, which comprises of Tungsten (in one embodiment), is surrounded by a Titanium Nitride layer 684 to provide a suitable electrode for the resistance switching material. Each Titanium Nitride layer 684 is surrounded by reversible resistance switching material 686. FIG. 10B shows the row select lines 672 positioned between oxide regions 670, surrounding the vertical select devices (depicted as n+p-n+ transistors). FIG. 10B also shows the global bit line as a metal layer 674 below the n+ poly layer 673.

In prior designs, word line drivers were implemented in the substrate but outside the memory array (rather than underneath the memory array). To make the integrated circuit smaller, it is preferable to implement the word line drivers underneath the memory array. In some cases, a word line driver is as big in size as 16 word lines aggregated. Thus, the word line drivers have been too big to fit underneath the memory array. One proposed solution, for some embodiments (but not all embodiments) is to connect one word line driver to a group of multiple word lines connected together, where a memory system will have many of such groups. In one example implementation, 16 (or another number of) word lines will be connected together, and the connected group of word lines will be connected to a single word line driver. In one example, the 16 word lines are connected together to form a comb shape. However, other shapes can also be used. Using one word line driver to drive 16 (or a different number of) word lines in a single comb (or other shaped structure) reduces the number of word line drivers need. Therefore, the word line drivers can fit underneath the memory array. The use of the vertically oriented select devices described above also provides more room underneath the memory array (e.g., in the substrate) in order to implement the word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines will settle quicker and there is no significant transient effect that will cause a disturb for unselected memory elements.

Figure 11:
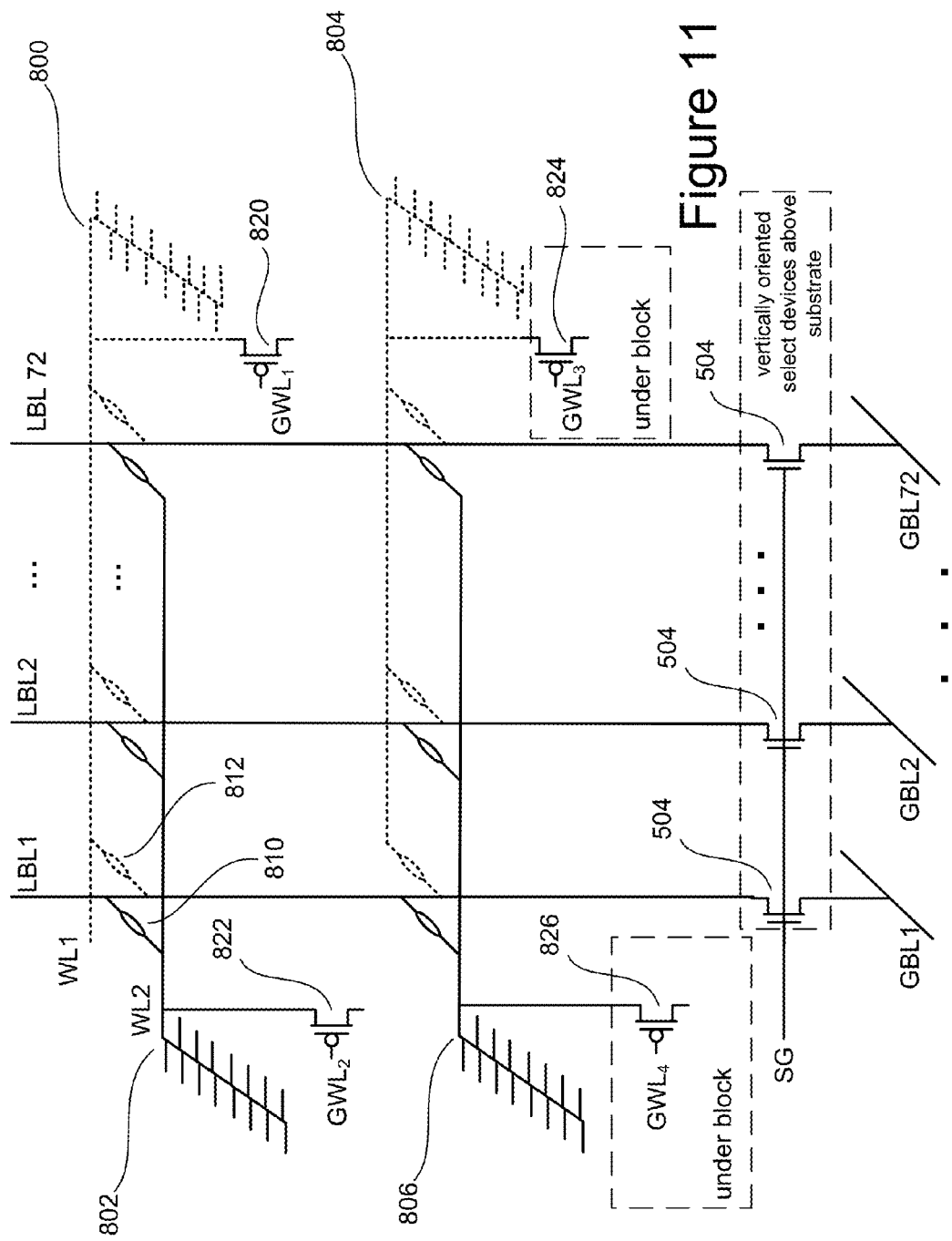
FIG. 11 is a schematic of a portion of the memory system, depicting vertical bit lines, vertically oriented select devices above the substrate and word line combs (connected word lines).

FIG. 11 is a partial schematic depicting a portion of a memory system which uses the comb structure described above. For example, FIG. 11 shows combs 800, 802, 804 and 806. A memory system is likely to have many more combs than depicted in FIG. 11; however, FIG. 11 will only show four combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block. In other embodiments, the word lines are one connected on one side of the word line comb.

FIG. 11 shows that combs 800 and 802 (and all of the attached word line fingers) are in a first plane or level of the memory array, and combs 804 and 806 (and all of the attached word line fingers) are on a second plane or level of the memory array. Each of the combs has a signal line to one word line driver. For example, word line comb 800 is connected to word line driver 820. When word line comb 800 is selected, all of the word line fingers connected to word line comb 800 are selected (e.g., receive the selected word line signal). Word line comb 802 is connected to word line driver 822. Word line comb 804 is connected to word line driver 824. Word line comb 806 is connected to word line driver 826. Word line drivers 820, 822, 824 and 826 are implemented underneath the memory array in the substrate. In one embodiment, a word line driver is located underneath the block (or one of the blocks) for which it is connected to.

FIG. 11 shows that word line comb 800 includes word line WL1 which is connected to memory elements that are in turn connected to local bit lines LB1, LB2, . . . LB72 (72 local bit lines). Word line comb 802 includes word line WL2 that is also connected to memory elements for the same 72 local bit lines LBL1, LBL2, . . . LBL72. In this arrangement, word line comb 800 is on one side of the memory array and word line comb 802 is on the opposite side of the memory array such that the word line fingers from comb 800 are interleaved with the word line fingers of word line comb 802. To make it easier to read, FIG. 11 is created such that word line combs 800, 804, and their word line fingers appear as dotted lines to show that they are from the right side of the memory array while combs 802, 806 are solid lines to show that they are from the left side of the memory array. In this arrangement, each memory element connected to a word line of word line comb 802 for the block being depicted will have a corresponding memory element connected to a word line for word comb 800 that connects to the same local bit line. For example, memory element 810 (connected to WL2) and memory element 812 (connected to WL1) are both connected to LBL1. Therefore, the system has to be operated such that if LBL1 is selected, only appropriate memory element 810 or 812 should be selected. Note that the local bit lines are connected to the appropriate global bit lines by the vertically oriented select devices 504 (described above) that are above the substrate. In other embodiments, the word line comb structure can be used without using the vertically oriented select devices. For example, the word line comb structures can be used with select devices that are implemented in the substrate. FIG. 11 could also be modified to show the word line combs only having word lines on each side of the word line comb.

Figure 12:
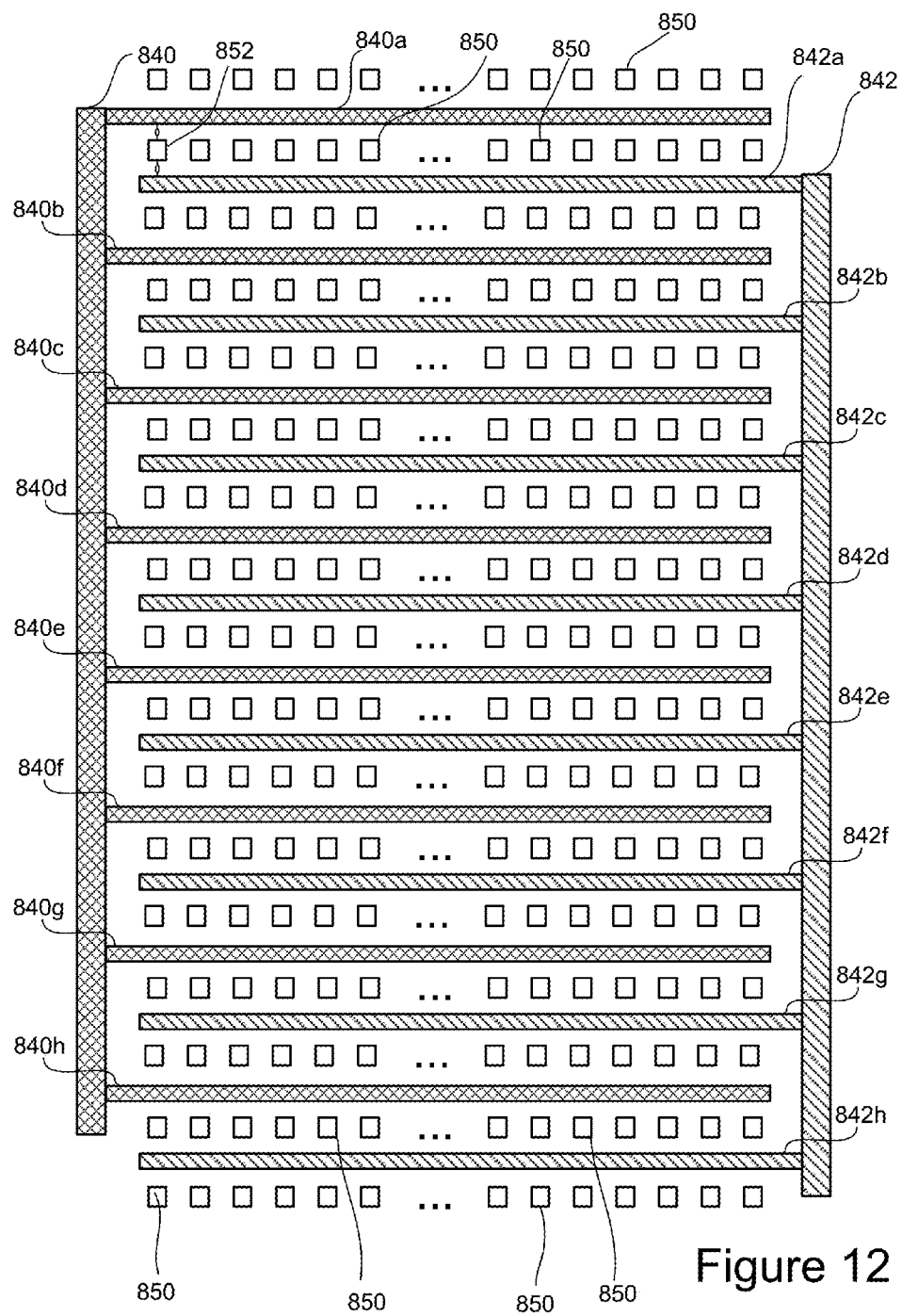
FIG. 12 is a top view of two word line combs and multiple vertical bit lines.

FIG. 12 is a top view of one layer of the memory array depicting part of two word line combs 840 and 842. As described above, each word line comb has word line fingers on two sides of its spine; however, in other embodiments the word line comb will only have word line fingers on one side of the spine. FIG. 12 only shows the word line fingers on one side of each spine; however, the teachings of FIG. 12 apply to embodiments that have word line fingers on two sides of its spine as well as embodiments that have word line fingers on only one side of its spine.

Word line comb 840 includes word line fingers 840a, 840b, 840c, 840d, 840e, 840f, 840g and 840h. Word line comb 842 includes word line fingers 842a, 842b, 842c, 842d, 842e, 842f, 842g and 842h. Between adjacent word line fingers from word line combs 840 and 842 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory element. To make the drawing easy to read, memory elements are only depicted for local bit line 852.

Because two word line comb structures are interleaved and share local bit lines, biasing memory elements connected to one of the word line combs (and not the other) will have an effect on the other word line comb. Biasing the vertical bit lines will have an effect on all memory element (for any word line comb) connected to those bit lines, even though the respective word line combs are not biased. Biasing a word line comb will bias all 16 (or other number of) word line fingers that are part of that word line comb. However, it is typically desired to only program or read from memory elements connected to one word line finger of the comb. FIGS. 21A and 21B will explain various biasing techniques to prevent a disturb.

Figure 13A:
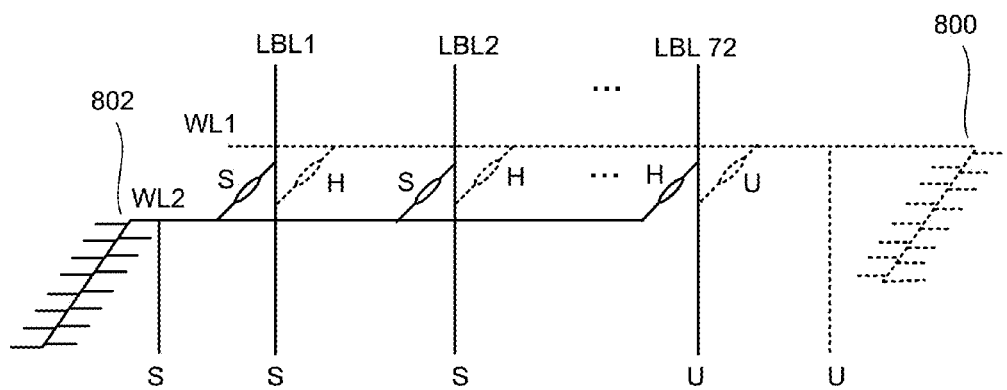
FIGS. 13A and B are schematics of a portion of a memory system, and show word lines combs.

FIG. 13A shows word line combs 800 and 802 from FIG. 11. These word line combs are interleaved. In one example, word line comb 802 is biased as a selected word line and word line comb 800 receives the unselected word line voltage. In this example, local bit line LB1 and local bit line LB2 are biased with the selected bit line voltage while all of the other local bit lines will be unselected. In this arrangement, therefore, those memory elements connected from WL2 to LBL1 and from WL2 to LBL2 are selected (S). Those memory elements connected between WL1 and LBL1 and WL1 and LBL2 are half selected (H) because one of the two control lines are biased. Memory elements connected to WL2 that are also connected to unselected local bit lines are half selected (H). Memory elements connected between WL1 and unselected local bit lines are unselected (U). Fully selected memory elements (S) will experience a voltage differential to cause a memory operation. Half selected memory elements will have a small voltage differential that is not large enough to cause a memory operation to occur. Unselected memory elements will experience no (or minimal) voltage differential.

Figure 13B:
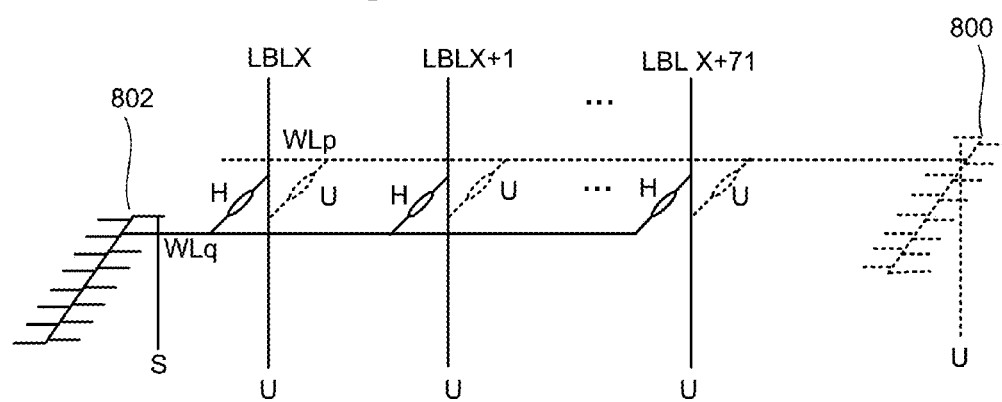

FIG. 13B depicts the case that explains how word line fingers connected to a selected word line comb will not cause disturb to memory elements that should not be selected. For example, word line comb 802 is selected, therefore, word line WLq will receive the program signal. However, it is not desired to program any memory elements connected to word line WLq. Unselected local bit lines LBLX, etc. will be receiving the unselected bit line voltage or floating (as appropriate by the particular implementation). Note that word line WLp receives the unselected word line voltage from word line comb 800. The unselected memory elements U along word line WLp and many other unselected cells on other memory levels provide a leakage path from unselected word lines such as WLp to the unselected bit lines LBLX, LBLX+1, etc. through LBLX+2. Even if many of the memory elements are in the high resistance state, the leakage path is sufficient to bring the unselected bit lines near to the unselected word line voltage in the case of floating unselected bit lines. The unselected bit line voltage and unselected word line voltage are both intermediate to the selected bit line voltage and selected word line voltage, and in many embodiments approximately equal. In either case, the unselected bit lines are at an intermediate unselected voltage bias The memory elements that are connected to WLq (H) are connected on the other terminal to these unselected bit lines that are near the unselected voltage bias. Therefore, each of the memory elements connected to WLq will be half selected (H) and safe from disturb.

Word line comb 800, which is not selected, will not provide a programming voltage to word line WLp. Therefore, all the memory elements connected between word line WLp and the local bit lines that are unselected will be completely unselected (U).

Figure 15:
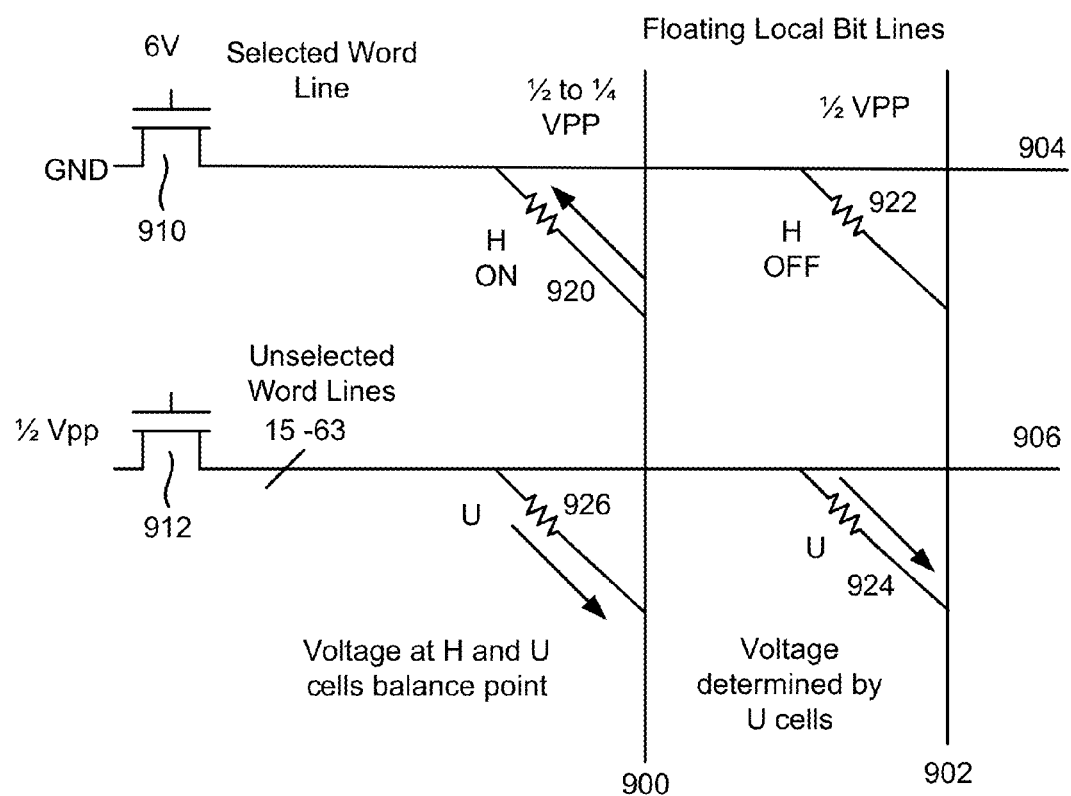
FIG. 15 is a schematic of a portion of the memory system, depicting the programming operation.

FIG. 14A is a flow chart describing one embodiment for programming memory elements. The process of FIG. 14A can be performed as part of a SET process or as part of a RESET process. FIG. 15 is a partial schematic of four memory elements 920, 922, 924 and 926 connected to local bit lines 900 and 902 and connected to word line fingers 904 and 906. The schematic at FIG. 15 will be used to explain the process of FIG. 22A and how disturb is avoided.

In Step 850, all word lines are driven to a common signal of ½ VPP. For example, word lines 904 and 906 will be driven to ½ VPP. In general ½ Vpp represents the intermediate unselected word line voltage and is not necessarily exactly half the programming voltage Vpp. Due to IR drops and other particulars of each embodiment the intermediate unselected biases can be adjusted higher or lower than half the programming voltage and may range from ¼ to ¾ of the Vpp. FIG. 15 shows transistor 912 applying ½ VPP to word lines 906. In one embodiment, VPP is the largest voltage used on the integrated circuit for the memory array. One example of VPP is 4 volts; however, other values can also be used. In step 852, the local bit lines are all floated; therefore, they will drift to or near ½ VPP. In step 854, ½ VPP (e.g., an unselected voltage) is applied to all global bit lines. In step 856, one or more data dependent signals are applied to the global bit lines; for example, VPP is applied to only the selected global bit lines. In step 858, the vertically oriented select devices discussed above (e.g. switch 504) are turned on in order to connect the selected local bit lines to the selected global bit lines. In step 860, selected local bit lines will rise to or toward VPP. In step 862, the selected word line comb is pulled down to ground. In some embodiments more than one word line comb can be pulled down to ground. In other embodiments, only one word line comb can be selected at a time.

In some embodiments, a higher than normal programming voltage may be required the first time a variable resistance memory element is SET into the low resistance state as the variable resistance memory element may be placed into a resistance state that is higher than the high resistance state when fabricated. The term "FORMING" may refer to setting the variable resistance memory element into the low resistance state for the first time after fabrication. After a FORMING operation is performed, the variable resistance memory element may be RESET to the high resistance state and then SET again to the low resistance state.

FIG. 15 shows transistor 910 being used to pull down word line 904 (a word line finger) to ground. Note in the example of FIG. 15, memory element 920 is on; therefore, when the floated bit lines rises toward ½ VPP, local bit line 900 may not rise all the way to ½ VPP because memory element 920 is conducting (low resistant state). Therefore, local bit line 900 may be a little bit below ½ VPP (in some cases as far down as ¼ VPP). In the above discussion, the bit lines are self-biasing, in that they are left floating and still able to bias the appropriate voltages to avoid disturbs. There is one half selected (H) memory element in each floating bit line which sees current from the floating bit line while the more numerous unselected memory elements (U) supply current to the unselected bit line. The self-biasing saves power and is safe for disturb. For unselected bit lines that have the half selected memory element (H) 922 in an off-state, the bit line rises to ½ VPP through unselected memory elements (U), but current is low and there is no disturb. For unselected bit lines that have the H memory element 920 in a low resistance state, the local bit line falls to a voltage in the range of ¼ to ½ VPP, but this self biasing wastes no power compared alternatives that might bias all bit lines at an unselected bit line bias and no memory elements are disturbed.

FIG. 14B is a flow chart describing other embodiments for programming memory elements. The process of FIG. 14B is similar to the process of FIG. 14A, except that the voltage differential experienced by the programmed memory elements has a reverse polarity. Therefore, if the process of FIG. 14A is used to SET the memory element, then the process of 14B can be can be used to RESET the memory element. Similarly, if the process of FIG. 14A is used to RESET the memory element then the process of FIG. 14B can be used to SET the memory element. In step 870 of FIG. 14B, all word lines are driven to a common signal of ½ VPP. In step 872, all local bit lines are floated and they will therefore drift to at or near ½ VPP. In step 874, ½ VPP is applied to the all global bit lines. In step 876, one or more data dependent signals are applied to the global bit lines; for example, the selected global bit lines are pulled down to ground. In step 878, the vertically oriented select devices are turned on to connect the selected local bit lines to the selected global bit lines. In step 880, the selected local bit lines are pulled down to or toward ground in response to being connected to the global bit lines. At step 882, VPP is then applied to the selected word line comb (or multiple word line combs in some embodiments) in order to create the appropriate differential to cause the programming operation to be performed.

FIG. 16 is a flow chart describing one embodiment of a process for reading memory elements. FIG. 17 is an accompanying partial schematic to explain the process of reading depicted in FIG. 16. In step 940 of FIG. 16, all word lines are driven to a common signal of Vread. In one embodiment Vread is equal to 2 volts; however, other values can also be used. In step 942, the local bit lines are floated; therefore, they will drift to or near Vread. Some floating local bit lines will drift to a voltage just under Vread if they are connected to a memory element in the low resistance state. In step 944, the global bit lines are charged to one or more signals; for example, the global bit lines are charged to Vread. In step 946, the selected word line comb (or in some embodiments multiple word line combs) are pulled down to ground. In step 948 the appropriate vertically oriented select devices are turned on in order to connect the appropriate selected local bit lines to the selected global bit lines. In step 950, current through the selected memory element (for example memory element 980 in FIG. 17) flows from the selected bit line, from the vertical select device, from the associated global bit line, through a current conveyor clamp device, and ultimately from a sense node in the associated sense amplifier. In step 952, the sense amplifier will sense the current and determine the state of the memory element.

FIG. 17 shows selected local bit lines 960, 962, as well as word lines 964, 966 (word line fingers). FIG. 17 also shows memory elements 980, 982, 984, and 986. Vread is applied to the unselected word lines, as depicted by transistor/switch 970. The local bit lines 960 and 962 will draft towards Vread. Switch 968 pulls down selected word line 964 to ground (see step 946). Because memory element 980 is turned on (low resistant state), bit line 960 may drift to a level a little bit less than Vread. In this example, both bit lines 960 and 962 are selected; therefore, current through memory elements 980 and 982 are passed to associated global bit lines (not shown) and to associated sense amplifiers. Since word line 966 is not selected, it is biased at Vread, memory elements 984 and 986 have zero or very close to zero volts differential bias and contribute negligible current to the associated selected bit line. If bit lines 960 were not selected either by floating or by connection to a global bit line with no associated sense amplifier, current would flow through memory element 980 decreasing the bit line 960 below Vread. Unselected memory elements 986 would conduct also and the bit line would drift to a voltage below Vread Since there is no connection to an active sense amplifier, this current is not sensed. For these unselected bit lines, the bit lines are self-biasing, in that they are left floating and still able to bias the appropriate voltages to avoid disturbs. There is one memory element 980 or 982 in each bit line connected to a selected word line 964 which sinks current from the bit line while the more numerous unselected memory elements (U) supply current to the bit line. The self-biasing saves power and is safe for disturb.

Endurance

One feature of non-volatile storage systems is endurance, which is the ability to perform more than one hundred thousand SET-RESET cycles, One strategy for maintaining endurance is to operate at a low current, which also saves power. It is proposed to use a local resistor produced by the forming operation to protect the switching layer (ie the reversible resistance-switching material) to cycle at low currents.

Figure 18A:
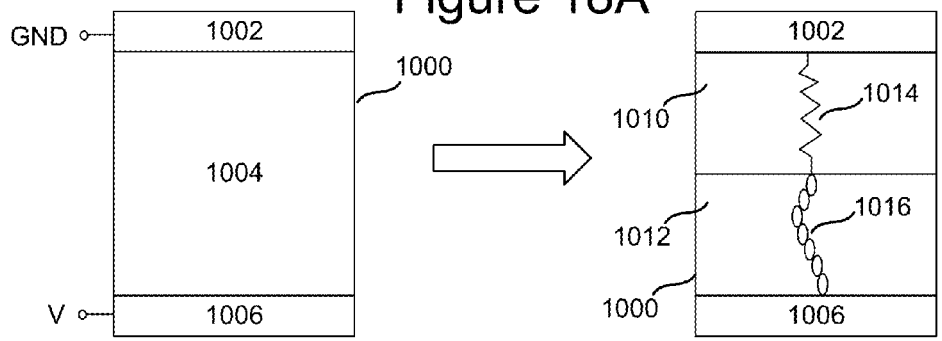
FIGS. 18A-C depict a forming operation be performed on a memory cell.

FIG. 18A depicts an example memory cell (non-volatile storage element) of structure 1000 undergoing a forming operation that creates a resistor. The left side of the arrow represents the memory cell of structure 1000 undergoing the forming operation. The right side of the arrow represents the memory cell of structure 1000 after the forming operation. Structure 1000 of FIG. 18A includes layers 1002, 1004 and 1006, with layer 1004 positioned between layers 1002 and 1006. In one embodiment, layer 1002 is part of the bit line, and comprises n+polysilicon (although other materials can be used). In one embodiment, layer 1006 is a TiN (or Ti) layer, similar to Titanium Nitride layer 684 of FIG. 10B. In other embodiments, layer 1006 is part of the word line. Layer 1004 can be one or more layers of reversible resistance-switching material. For example, layer 1004 can be HfOx. Note that no resistor (or material that comprises a resistor) has been deposited. In one example, the forming operation includes applying a forming voltage V to the word line or layer 1006 and grounding the bit line (or layer 1002). Upon completion of the forming operation, the memory cell includes layer 1010 and layer 1012, both of which were formed from layer 1004. Layer 1010 includes a resistor 1014 that was created in response to the forming condition including voltage V, current I and pulse width (as opposed to being deposited). Layer 1012, which is comprised of the reversible resistance-switching material, will be used as the switching layer and, in some embodiment, includes a filament 1016. In some embodiments that start with multiple layers of reversible resistance-switching material, layer 1014 can be formed in one layer of reversible resistance-switching material and layer 1016 can be formed from another layer of reversible resistance-switching material.

Figure 18B:
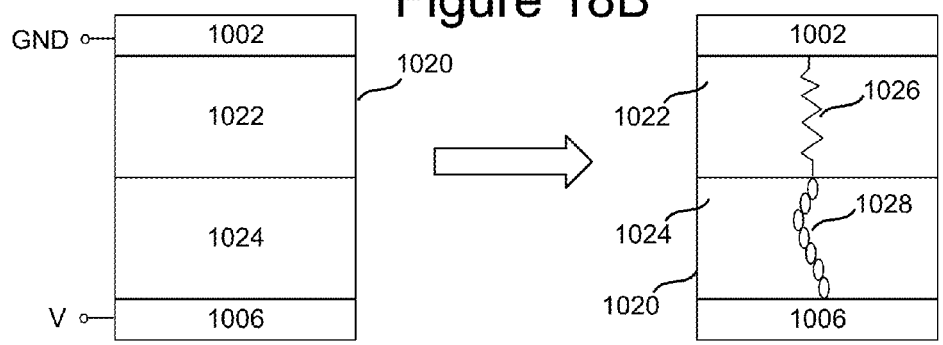

FIG. 18B depicts a memory cell of structure 1020 undergoing a forming operation that creates a resistor. The left side of the arrow represents the memory cell of structure 1020 undergoing the forming operation. The right side of the arrow represents the memory cell of structure 1020 after the forming operation. Structure 1000 of FIG. 18B includes layers 1002, 1022, 1024 and 1006. Layers 1022 and 1024 are positioned between layers 1002 and 1006. In one embodiment, layers 1022 and 1024 are separate layers of the same or different reversible resistance-switching materials. Note that no resistor (or material that comprises a resistor) has been deposited. In one example, the forming operation includes applying a forming voltage V, current and pulse width to the word line or layer 1006 and grounding the bit line (or layer 1002). Upon completion of the forming operation, layer 1022 includes a resistor 1026 that was created in response to the forming condition (as opposed to being deposited), such as forming voltage, forming current and/or pulse width. Layer 1024 will be used as the switching layer and, in some embodiment, includes a filament 1028.

Figure 18C:
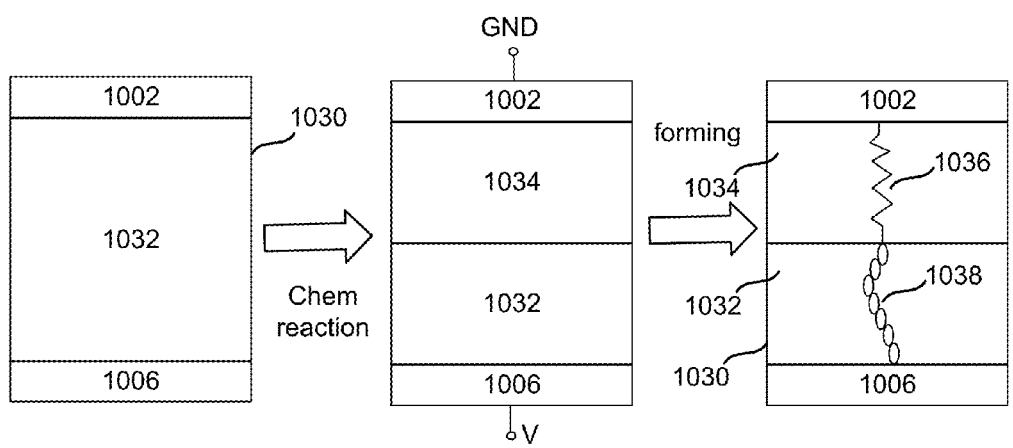

In one embodiment, layer 1022 and 1024 form a single memory cell, with layer 1024 comprising a reversible resistance-switching material and layer 1022 comprising a material that is not a reversible resistance-switching material. For example, layer 1022 can be an oxide layer. In one example, layer 1022 comprises SiOx, with K~3.9 and layer 1024 comprises HfOx with K~22. After forming, the HfOx layer is significantly easier to switch than the SiOx layer. In one implementation, the SiOx layer is intentionally deposited. In another embodiment, the SiOx layer is not deposited. Rather, the HfOx (or other material) is deposited. Then, at the junction of the HfOx and the n+ polysilicon, the SiOx is automatically and dynamically generated. This situation is depicted in FIG. 18C which shows a memory cell of structure 1030 comprising a layer 0132 between layers 1002 and 1006. In one embodiment, layer 1032 is HfOx that was deposited as the only layer between layers 1002 and 1006. In other embodiments, other materials can be used instead of HfOx. Due to oxidation of the polysilicon layer caused by a subsequent thermal treatment (e.g., a rapid thermal anneal for 2 minutes at 750 degrees C.), SiOx layer 1034 is created. A forming operation is then performed, resulting in a resistor 1036 being created in SiOx layer 1036 in response to the forming condition at voltage V, current I and pulse width PW and a filament 1038 is formed in layer 1032. The resistor that is created can be used to protect the switching layer to cycle at low current.

FIG. 18C shows one embodiment that includes depositing a particular layer of reversible resistance-switching material, depositing a polysilicon layer adjacent the particular layer of reversible resistance-switching material and automatically generating an interface layer in the first region between the polysilicon layer and the particular layer of reversible resistance-switching material by a reaction of the polysilicon layer with the particular layer of reversible resistance-switching material. The resistor is created in the interface layer in response to the forming operation.

Figure 19:
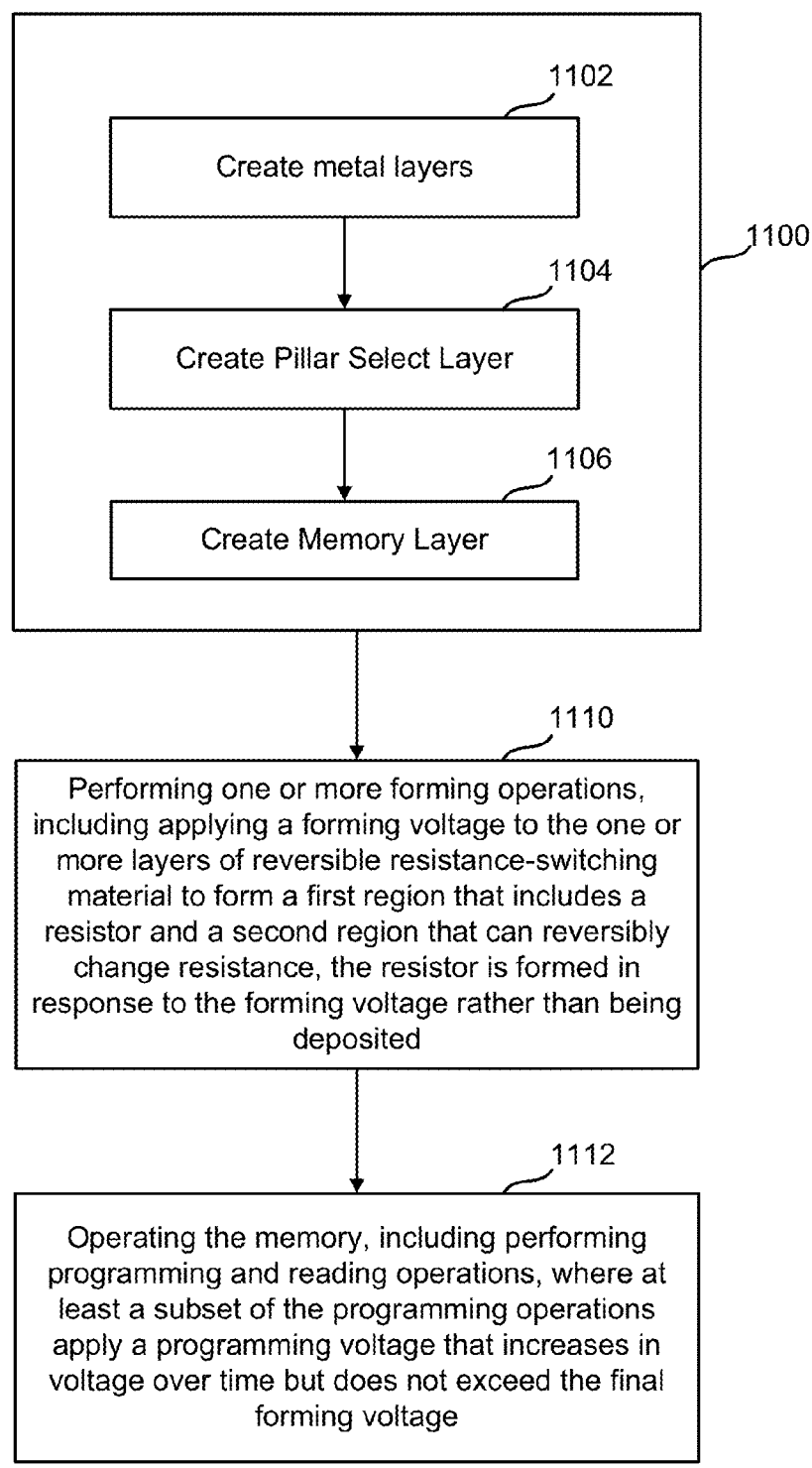
FIG. 19 is a flow chart describing one embodiment of a process used with non-volatile storage.

FIG. 19 is a flow chart describing one embodiment of a process of making and using the non-volatile storage described herein. In step 1100 of FIG. 19, the non-volatile storage system is manufactured, which includes creating metal layers in step 1102, creating pillar select layers in step 1104 and creating memory layers in step 1106. Step 1110 includes performing one or more forming operations, including applying a forming voltage at a low current to the one or more layers of reversible resistance-switching material to form a first region that includes a resistor and a second region that can reversibly change resistance (switching layer). The resistor is formed in response to the forming condition rather than being deposited. Step 1110 can be performed as part of the manufacturing process, as part of the post-manufacturing testing, or when first powered by an end user. Step 1112 includes operating the memory, including performing programming (e.g., SET and RESET) and reading operations, where at least a subset of the programming operations apply a programming voltage at low current that increases in voltage over time but does not exceed the final forming voltage Step 1112 can be performed many times.

FIG. 20 is a flow chart describing one embodiment of a process performed when creating a memory layer. The process of FIG. 20 is performed as part of step 1106 of FIG. 19. In step 1200, word lines are deposited. In step 1202, a TiN layer is deposited (for those embodiments that have a TiN layer). In step 1204, one or more one or more layers of reversible resistance-switching material is/are deposited, without depositing resistors or materials comprising resistors. In step 1206, bit lines are deposited.

FIG. 21 is a flow chart describing one embodiment of a forming operation. The process of FIG. 21 is performed as part of step 1110 of FIG. 19. In step 1250 of FIG. 21, a voltage pulse is applied to the memory cells at a low current (e.g., less than 5 uA). For example, a voltage pulse is applied to the word lines. In other embodiments, the voltage pulse can be applied to the bit lines. In some embodiments, the forming voltage comprises a series of voltage pulses that increase in magnitude and/or width with each successive pulse. The final voltage pulse that causes the memory cell to successfully complete the forming process has a magnitude that is referred to as the final forming voltage. In one embodiment, the SET process will use a programming voltage that increases in voltage over time at low current (e.g., <5 uA) but does not exceed the final forming voltage. For example, the SET process can use a series of voltage pulses or continuous voltage that increases over time at low current under control (e.g., a current less than 10 uA or less than 3 uA). Between pulses of the forming operation, a read process is performed by applying a read voltage. The current through the memory cells in response to the read voltage (this current will be referred to as the read current) will be measured to determine if the forming process successfully completed (step 1252 of FIG. 21). If the read current through the memory cell being formed exceeds the threshold (step 1254), then the forming process successfully completed and the resistor has been created, as described in FIG. 18 (step 1258). If the read current does not exceed the threshold (step 1254), then the forming process has not yet successfully completed; therefore, the magnitude of the voltage pulse is increased (but not to exceed a maximum forming voltage) in step 1256 and the process loops back to step 1250. Note that the resistance of the resistor created in step 1258 can be tuned based on the magnitude of the voltage pulses, the width of the voltage pulses, the current provided at forming or the thickness of the reversible resistance-switching material (see FIGS. 18A-C).

Figure 22:
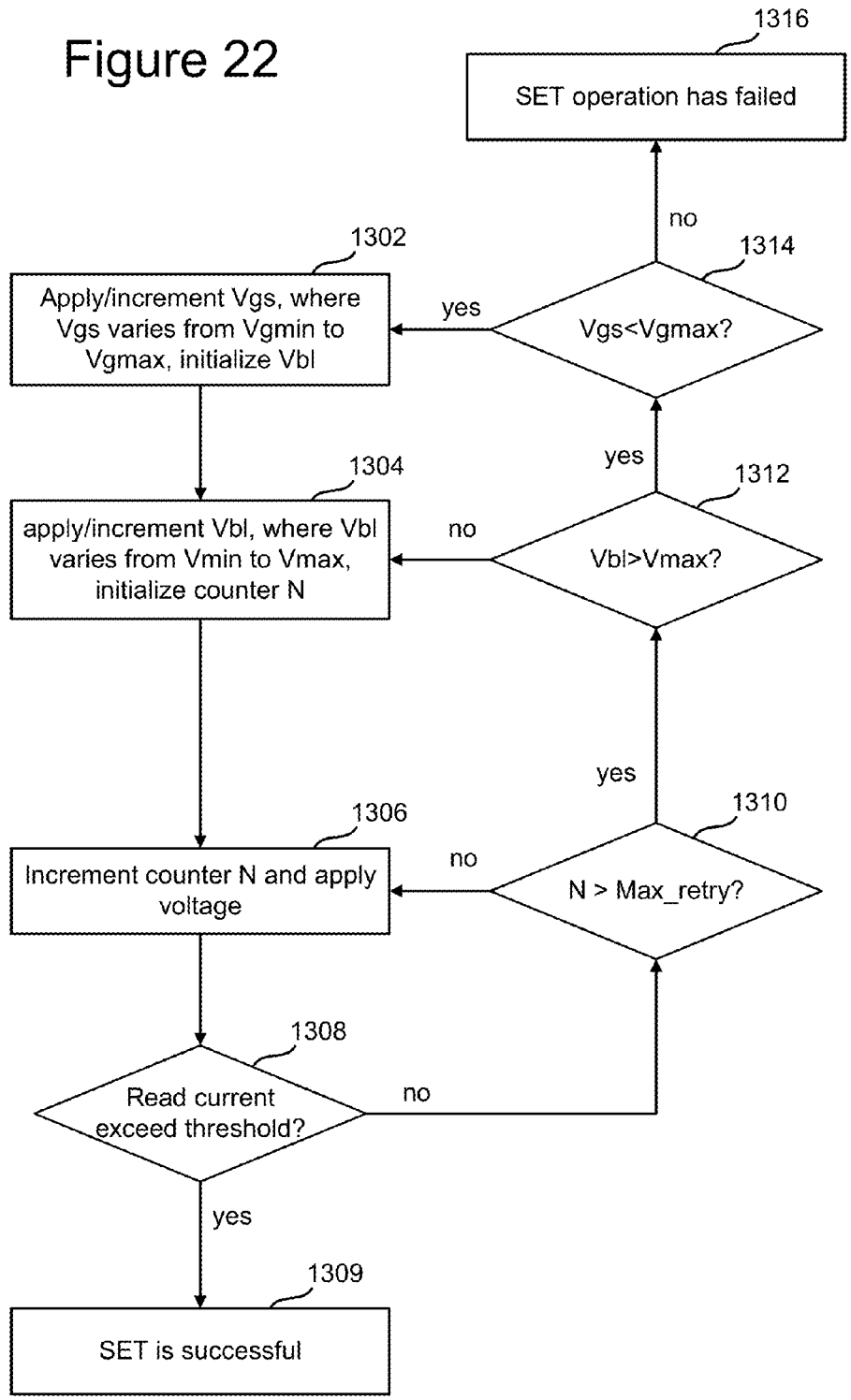
FIG. 22 is a flow chart describing one embodiment of a programming operation.

FIG. 22 is a flow chart describing one embodiment of a SET process that sets the resistance of the reversible resistance-switching material to the low resistance state. The process of FIG. 21 is performed as part of step 1112 of FIG. 19. The process of FIG. 22 includes apply a series of voltage pulses to the memory cell using the same polarity as the forming process (e.g., apply the voltage to the word line while the bit line is grounded). The pulses increase in magnitude with each new pulse, and between pulses the read current through the memory cell is tested to determine whether the SET operation was successful. In step 1302, the system will apply a gate voltage Vgs to the vertical select devices that connects the global bit line to the local vertical bit lines. The first time Vgs is applied, the system applies Vgmin volts. Each iteration of step 1302 includes stepping up Vgs to a higher voltage to control current at higher level, with the maximum (magnitude) Vgs being Vgmax Also, in step 1302, the bit line voltage Vbl applied to the global bit line is initialized to Vmin (w.g., 1.7 v). Step 1302 includes applying a gate voltage signal to the vertically oriented select devices that increases over time but is limited to be less than a maximum gate voltage.

In step 1304, the bit line voltage is applied to the global bit line, for application to the appropriate local vertical bit lines via the vertically oriented select devices. Each iteration of step 1304 includes incrementing Vbl to a higher voltage, with a maximum Vbl of Vmax. In step 1306, a counter N is incremented and the SET voltage is applied to the memory cell via the word line. Note that the processes of FIGS. 14A and/or 14B can be performed as part of step 1306. In step 1308, it is determined whether the read current through the memory cell being SET is greater than a predetermined threshold. If the read current through the memory cell being SET is greater than a predetermined threshold, then the SET operation is successful (Step 1309). If the read current through the memory cell being SET is not greater than a predetermined threshold, the SET operation is not finished and the process loops to step 1310.

In step 1310, it is determined whether the counter N is greater than a maximum value Max_retry. If not, the process proceeds to step 1306 and another voltage pulse is applied. If the counter N is greater than a maximum value Max_retry, then it is determined in step 1312 whether the bit line voltage Vbl is greater than the Vmax. If not, the bit line voltage is incremented in step 1304. If so, then it is determined whether the magnitude of Vgs is less than Vgmax in step 1314. If the magnitude of Vgs is less than Vgmax, then Vgs is incremented in step 1302, and Vbl is initialized, and the process continues at step 1302. If the magnitude of Vgs is Vgmax or higher, then the SET operation has failed (step 1316). This process of FIG. 22 will keep the voltage through the memory cell at low voltages, which will help endurance.

One embodiment includes a method for use with non-volatile storage, comprising: depositing one or more layers of reversible resistance-switching material for a non-volatile storage element; and applying a forming voltage to the one or more layers of reversible resistance-switching material to form a first region that includes a resistor and a second region that can reversibly change resistance, the resistor is formed in response to the applying the forming voltage at a low current (e.g., <3 uA or 10 uA).

In some embodiments, the applying the forming voltage at a low current includes applying a voltage signal that increases in voltage over time and has a final forming voltage and the method further comprises programming the non-volatile storage element by applying a programming voltage that increases in voltage over time but does not exceed the final forming voltage.

In some embodiments, the applying the forming voltage is part of a forming process with a limiting current value (such as less than or equal to 10 uA or 3 uA). In one embodiment, the method further comprises tuning a resistance of the resistor by adjusting the forming voltage or by adjusting the limiting current value.

In some embodiments, the applying the forming voltage at a low current includes applying a voltage signal that increases in voltage over time and has a final forming voltage; the method further comprises programming the non-volatile storage element; the non-volatile storage element is part of a monolithic three dimensional memory array of non-volatile storage elements that includes a plurality of global array lines, a plurality of vertically oriented local array lines connected to the monolithic three dimensional memory array of non-volatile storage elements, and a plurality of vertically oriented select devices that are above a substrate and are connected to the vertically oriented local array lines and the global array lines; the programming includes applying a gate voltage signal to the vertically oriented select devices that increases over time but is limited to be less than a maximum gate voltage to control the forming current; and the programming includes applying forming voltage signal to the global array lines that increases over time until programming is successful and is limited in magnitude to be less than the final forming voltage at a low current (<3 uA, 5 uA or 10 uA).

In some embodiments, the depositing the one or more layers of reversible resistance-switching material comprises depositing a particular layer of reversible resistance-switching material, depositing a polysilicon layer adjacent the particular layer of reversible resistance-switching material and automatically generating an interface layer between the polysilicon layer and the particular layer of reversible resistance-switching material by a thermal treatment and the resistor is created in the interface layer in response to the forming voltage at a low current (<3 uA).

In some embodiments, the applying a forming voltage includes applying a voltage pulse having a duration; and the method further comprises tuning a resistance of the resistor by adjusting the pulse duration.

One embodiment includes a method for use with non-volatile storage, comprising: depositing one or more layers of reversible resistance-switching material for a first region of a non-volatile storage element; and applying a forming voltage to the first region to create a resistor in the first region in response to the forming voltage at a low current (e.g., less than 3 uA or less than 10 uA).

One embodiment includes a method for use with non-volatile storage, comprising: applying a forming voltage to a first region of a non-volatile storage element that includes one or more layers of reversible resistance-switching material to form a resistor in the first region, the applying the forming voltage includes applying a voltage signal that increases in voltage over time and has a final forming voltage at low current under control; and programming the non-volatile storage element by applying a programming voltage that increases in voltage over time but does not exceed the final forming voltage at low current under control. In one example, the low current can be less than 10 uA or less than 3 uA.

One embodiment includes a non-volatile storage system, comprising: a substrate; a monolithic three dimensional memory array including a set of non-volatile storage elements positioned above and not in the substrate; a plurality of word lines connected together and connected to the set of non-volatile storage elements; a word line driver in the substrate, below the set of non-volatile storage elements and in communication with all of the word lines connected together; a plurality of global bit lines; a plurality of vertically oriented bit lines connected to the set of memory cells; a plurality of vertically oriented select devices that are above, but not in the substrate, that are connected to the vertically oriented bit lines and the global bit lines, when the vertically oriented select devices are actuated the vertically oriented bit lines are in communication with the global bit lines; and global bit line drivers connected to the global bit lines, the global bit line drivers apply one or more forming voltages to regions of the set of non-volatile storage elements that include one or more layers of reversible resistance-switching material to form resistors in the regions in response to the one or more forming voltages at a low current under control. the vertically oriented select devices limit the current flowing through the one or more layers of reversible resistance-switching material during the application of the one or more forming voltages by the global bit line drivers to a limiting current value.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A method for use with non-volatile storage, comprising:
depositing one or more layers of reversible resistance-switching material for a non-volatile storage element;
applying a forming voltage to the one or more layers of reversible resistance-switching material to form a first region that includes a resistor and a second region that can reversibly change resistance, the second region is in series with the first region, the resistor is formed in response to applying the forming voltage; and
programming the non-volatile storage element;
the applying the forming voltage includes applying a voltage signal that increases in voltage over time and has a final forming voltage;
the non-volatile storage element is part of a monolithic three dimensional memory array of non-volatile storage elements that includes a plurality of global array lines, a plurality of vertically oriented local array lines connected to the monolithic three dimensional memory array of non-volatile storage elements, and a plurality of vertically oriented select devices that are above a substrate and are connected to the vertically oriented local array lines and the global array lines;
the programming includes applying a gate voltage signal to the vertically oriented select devices that is limited to be less than a maximum gate voltage;
the programming includes applying a programming voltage signal to the global array lines that is limited in magnitude to be less than the final forming voltage.

2. The method of claim 1, wherein:
the applying the forming voltage is part of a forming process with a limiting current value.

3. The method of claim 2, wherein the limiting current value is less than or equal to about 10 uA.

4. The method of claim 2, wherein the limiting current value is less than or equal to about 3 uA.

5. The method of claim 2, further comprising:
tuning a resistance of the resistor by adjusting the limiting current value.

6. The method of claim 1, wherein:
the first region and the second region are formed in a single layer of reversible resistance-switching material in response to the forming voltage.

7. The method of claim 1, wherein:
the one or more layers of reversible resistance-switching material comprises multiple layers of reversible resistance-switching material, the resistor is created in one of the layers of reversible resistance-switching material without depositing the resistor.

8. The method of claim 1, further comprising:
tuning a resistance of the resistor by adjusting the forming voltage.

9. The method of claim 1, wherein:
the applying a forming voltage includes applying a voltage pulse having a duration; and
the method further comprising tuning a resistance of the resistor by adjusting the pulse duration.

10. The method of claim 1, wherein:
the applying the forming voltage creates a filament in the second region, the filament is separate from the resistor.

11. The method of claim 1, wherein:
the non-volatile storage element is part of a monolithic three dimensional memory array of non-volatile storage elements.

12. A method for use with non-volatile storage, comprising:
depositing one or more layers of reversible resistance-switching material for a non-volatile storage element, the depositing the one or more layers of reversible resistance-switching material comprises:
depositing a particular layer of reversible resistance-switching material,
depositing a polysilicon layer adjacent the particular layer of reversible resistance-switching material, and
generating an interface layer between the polysilicon layer and the particular layer of reversible resistance-switching material by applying a thermal treatment; and
applying a forming voltage to the one or more layers of reversible resistance-switching material to form a first region that includes a resistor and a second region that can reversibly change resistance, the second region is in series with the first region, the resistor is formed in response to applying the forming voltage, the resistor is created in the interface layer in response to the forming voltage.

13. A method for use with non-volatile storage, comprising:
depositing one or more layers of reversible resistance-switching material for a non-volatile storage element, the depositing the one or more layers of reversible resistance-switching material comprises:
depositing a particular layer of reversible resistance-switching material,
depositing a polysilicon layer adjacent the particular layer of reversible resistance-switching material, and
generating an interface layer between the polysilicon layer and the particular layer of reversible resistance-switching material by applying a thermal treatment; and
applying a forming voltage to the reversible resistance-switching material to create a resistor and a filament separate from the resistor in the reversible resistance-switching material in response to the forming voltage, the resistor is created in the interface layer in response to the forming voltage.

14. The method of claim 13, wherein:
the applying the forming voltage includes applying a voltage signal that increases in voltage over time and has a final forming voltage; and
the method further comprises programming the non-volatile storage element by applying a programming voltage that does not exceed the final forming voltage.

15. The method of claim 13, wherein:
the resistor and a reversible resistance-switching region are formed in a single layer of reversible resistance-switching material in response to the forming voltage.

16. The method of claim 13, wherein:
the non-volatile storage element is part of a monolithic three dimensional memory array of non-volatile storage elements.

17. A method for use with non-volatile storage, comprising:
applying a forming voltage to the one or more layers of reversible resistance-switching material to form a first region that includes a resistor and a second region that can reversibly change resistance, the second region is in series with the first region, the resistor is formed in response to applying the forming voltage;
the applying the forming voltage includes applying a voltage signal that increases in voltage over time and has a final forming voltage;
the one or more layers of reversible resistance-switching material are part of a non-volatile storage element;
the non-volatile storage element is part of a monolithic three dimensional memory of non-volatile storage elements that includes a plurality of global array lines, a plurality of vertically oriented local array lines connected to the monolithic three dimensional memory array of non-volatile storage elements, and a plurality of vertically oriented select devices that are above a substrate and are connected to the vertically oriented local array lines and the global array lines;
the method further comprises programming the non-volatile storage element by applying a programming voltage that does not exceed the final forming voltage;
the programming includes applying a gate voltage signal to the vertically oriented select devices is limited to be less than a maximum gate voltage; and
the programming includes applying a programming voltage signal to the global array lines that is limited in magnitude to be less than the final forming voltage.

18. A method for use with non-volatile storage, comprising:
depositing one or more layers of reversible resistance-switching material including depositing a particular layer of reversible resistance-switching material, depositing a polysilicon layer adjacent the particular layer of reversible resistance-switching material and generating an interface layer in between the polysilicon layer and the particular layer of reversible resistance-switching material by applying a thermal treatment; and
applying a forming voltage to the one or more layers of reversible resistance-switching material to form a first region that includes a resistor and a second region that can reversibly change resistance, the second region is in series with the first region, the resistor is formed in response to applying the forming voltage, the resistor is created in the interface layer in response to the forming voltage.

* * * * *